United States Patent
Krames et al.

(10) Patent No.: US 7,642,108 B2
(45) Date of Patent: Jan. 5, 2010

(54) LED INCLUDING PHOTONIC CRYSTAL STRUCTURE

(75) Inventors: Michael R. Krames, Los Altos, CA (US); Mihail M. Sigalas, Santa Clara, CA (US); Jonathan J. Wierer, Jr., Pleasanton, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 11/868,854

(22) Filed: Oct. 8, 2007

(65) Prior Publication Data

US 2008/0070334 A1   Mar. 20, 2008

Related U.S. Application Data

(62) Division of application No. 10/059,588, filed on Jan. 28, 2002, now Pat. No. 7,279,718.

(51) Int. Cl.
 *H01L 21/00* (2006.01)
(52) U.S. Cl. .............. 438/22; 438/34; 438/39; 438/943; 257/E51.018
(58) Field of Classification Search ........... 438/22, 438/24, 47, 708, 717, 34, 39, 943
See application file for complete search history.

(56) References Cited

U.S. PATENT DOCUMENTS

| | | | |
|---|---|---|---|
| 5,371,025 | A | 12/1994 | Sung |
| 5,779,924 | A | 7/1998 | Krames et al. |
| 5,955,749 | A | 9/1999 | Joannopoulos et al. |
| 6,091,085 | A | 7/2000 | Lester |
| 6,156,581 | A | 12/2000 | Vaudo et al. |
| 6,307,218 | B1 | 10/2001 | Steigerwald et al. |

(Continued)

FOREIGN PATENT DOCUMENTS

EP   0874405 A2   10/1998

(Continued)

OTHER PUBLICATIONS

A. Kikuchi et al., "Self-Organized InGaN/GaN Multiple Quantum Well Nanocolumn Light Emitting Diodes Grown on (111) Si Substrate," Department of Electrical and Electronics Engineering, Sophia University, 1 page.

(Continued)

*Primary Examiner*—Wai-Sing Louie

(57) ABSTRACT

A photonic crystal light emitting diode ("PXLED") is provided. The PXLED includes a periodic structure, such as a lattice of holes, formed in the semiconductor layers of an LED. The parameters of the periodic structure are such that the energy of the photons, emitted by the PXLED, lies close to a band edge of the band structure of the periodic structure. Metal electrode layers have a strong influence on the efficiency of the PXLEDs. Also, PXLEDs formed from GaN have a low surface recombination velocity and hence a high efficiency. The PXLEDs are formed with novel fabrication techniques, such as the epitaxial lateral overgrowth technique over a patterned masking layer, yielding semiconductor layers with low defect density. Inverting the PXLED to expose the pattern of the masking layer or using the Talbot effect to create an aligned second patterned masking layer allows the formation of PXLEDs with low defect density.

10 Claims, 14 Drawing Sheets

U.S. PATENT DOCUMENTS

| | | | |
|---|---|---|---|
| 6,335,548 | B1 | 1/2002 | Roberts et al. |
| 6,363,096 | B1 | 3/2002 | Dodabalapur et al. |
| 6,534,798 | B1 | 3/2003 | Scherer et al. |
| 6,711,200 | B1 * | 3/2004 | Scherer et al. ............... 372/64 |
| 6,735,230 | B1 | 5/2004 | Tanabe et al. |
| 6,949,395 | B2 | 9/2005 | Yoo |
| 2002/0004307 | A1 | 1/2002 | Yamada |
| 2002/0109149 | A1 * | 8/2002 | Chang ........................ 257/98 |
| 2002/0130311 | A1 | 9/2002 | Lieber et al. |
| 2002/0159126 | A1 * | 10/2002 | Sigalas et al. ............... 359/245 |
| 2003/0016895 | A1 | 1/2003 | Holm et al. |
| 2003/0141507 | A1 | 7/2003 | Krames et al. |
| 2003/0235229 | A1 | 12/2003 | Deng et al. |
| 2004/0135155 | A1 | 7/2004 | Otsuka et al. |
| 2005/0035354 | A1 | 2/2005 | Lin et al. |
| 2005/0082543 | A1 | 4/2005 | Alizadeh et al. |
| 2005/0173714 | A1 | 8/2005 | Lee et al. |
| 2005/0173717 | A1 | 8/2005 | Lee et al. |
| 2005/0205884 | A1 | 9/2005 | Kim et al. |
| 2005/0223211 | A1 | 10/2005 | Sukegawa et al. |

FOREIGN PATENT DOCUMENTS

| | | |
|---|---|---|
| EP | 1071143 A1 | 1/2001 |
| JP | 07176788 A | 7/1995 |
| WO | 03/023857 A2 | 3/2003 |
| WO | 2006060599 A2 | 6/2006 |

OTHER PUBLICATIONS

P. Bhattacharya et al., "Electrically Injected Photonic Bandgap Microcavity Light Sources," LEOS 2001 14th. Annual Meeting of the IEEE Lasers & Electro-Optics Society, San Diego, Ca, Nov. 11-15, vol. 1 of 2, pp. 76 to 77.

Boroditsky et al," Light extraction from optically pumped light-emitting diode by thin-slab photonic crystals," Applied Physics Letters, vol. 75, No. 8, Aug. 23, 1999, pp. 1036-1038.

Boroditsky et al., "Surface recombiantion measurements on III-V candidate materials for nanostructure light-emitting diodes," Journal of Applied Physics, vol. 87, No. 7, Apr. 1, 2000, pp. 3497-3504.

Fan et al., " High Extraction Efficiency of Spontaneous Emission from Slabs of Photonic Crystals," Physical Review Letters, vol. 78, No. 17, Apr. 28, 1997, pp. 3294-3297.

S. Haffouz et al., "Effect of Magnesium and Silicon on the lateral overgrowth of GaN patterned substrates by Metal Organic Vapor Phase Epitaxy, "MRS Internet J. Nitride Semicond. Res. 3, 8 (1998), 1998-1999 The Materials Reseach Society, pp. 1 to 6.

T. Hamano et al. "New Technique for Fabrication of Two-Dimensional Photonic Bandgap Crystals by Selective Epitaxy," Jpn. J. Appl. Phys. vol. 36 (1997), pp. L286 to L288.

Hwang et al., "Spontaneous emission rate of an electric dipole in a general microcavity," Physical Review B, vol. 60, No. 7, Aug. 15, 1999, pp. 4688-4695.

Imada et al., "Coherent two-dimensional lasing action in surface-emitting laser with triangular-lattice photonic cyrstal structure," Applied Physics Letters, vol. 75, No. 3, Jul. 19, 1999, pp. 316-318.

S. Kitamura et al, "Fabrication of GaN Hexagonal Pyramids on Dot-Patterned GaN/Sapphire Substrates via Selective Metalorganic Vapor Phase Epitaxy," Jpn. J. Appl. Phys., vol. 34 (1995), Part 2, No. 9B, Sep. 15, 1995, pp. L1184 to L1186.

Lee et al., "Modified spontaneous emission from a two-dimensional photonic bandgap crystal slab," J. Opt. Soc. Am. B, vol. 17, No. 8, Aug. 2000, pp. 1438-1442.

M. Nagahara et al., "Selective Growth of Cubic GaN in Small Areas on Patterned GaAs (100) Substrates by Metalorganic Vapor Phase Epitaxy," Jpn. J. Appl. Phys., vol. 33 (1994), Part 1, No. 1B, Jan. 1994, pp. 694 to 697.

V.V. Mamutin, et al., "Growth of Self-Organized GaN Nanostructures on Al2O3 (0001) by RF MBE," Proc. Int. Workshop on Nitride Semiconductors, IPAP Conf. Series 1, pp. 413 to 416.

Pottage et al., "Vertical-cavity surface-emitting resonances in photonic crystal films," J. Opt. Soc. Am. A, vol. 18, No. 2, Feb. 2001, pp. 442-447.

G.B. Stringfellow and M. George Crawford, eds. "High Brightness Light Emitting Diodes," Academic Press, Inc., 1997, Chapter5, "AlGaInP Light-Emitting Diodes, " by F.A. Kish and R.M. Fletcher, pp. 149-170.

Tiwari, S., "Compound Semiconductor Device Physics," Academic Press, Inc., San Diego, CA, 1992, pp. 182-186.

Tredicucci et al., "Single-mode surface-plasmon laser," Applied Physics Letters, vol. 76, No. 16, Apr. 17, 2000, pp. 2164-2166.

Vuckovic et al., "Surface Plasmon Enhanced Light Emitting Diode," Journal of Quantum Electronics, vol. 36, 2000, pp. 1-13.

Windisch et al., "Light-emitting diodes with 31% external quantum efficiency by outcoupling of lateral waveguide modes," Applied Physics Letters, vol. 74, No. 16, Apr. 19, 1999, pp. 2256-2258.

Xu et al.,"Finite-difference time-domain calculation of spontaneous emission lifetime in a microcavity," J. Opt. Soc. Am. B, vol. 16, No. 3, Mar., 1999, pp. 465-474.

W. D. Zhou et al, "Electrically injected single-defect photonic bandgap surface-emitting laser at room temperature," Electronic Letters, Aug. 31, 2000, vol. 36, No. 18, pp. 1541 to 1542.

European Search Report, 10 pages.

\* cited by examiner

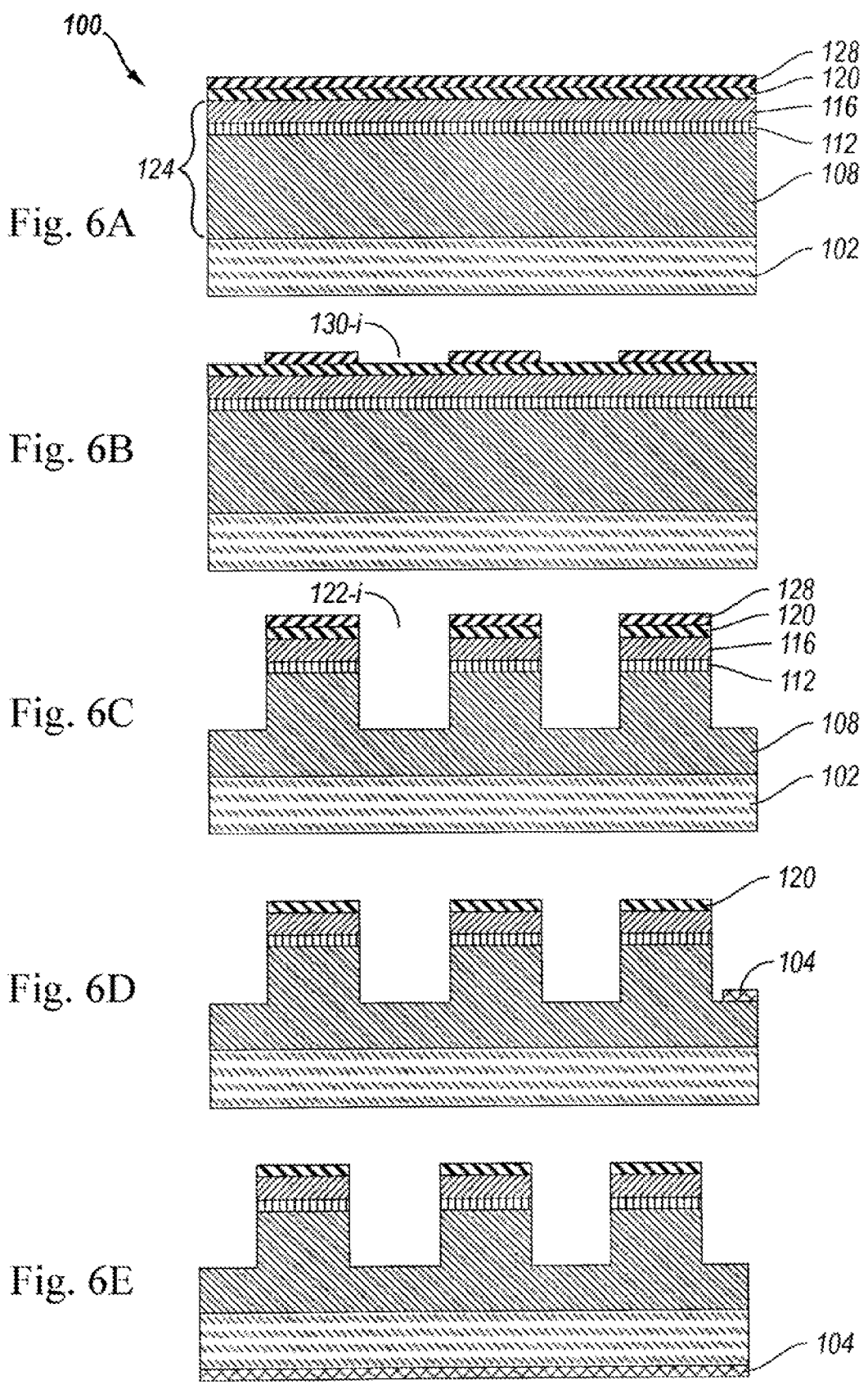

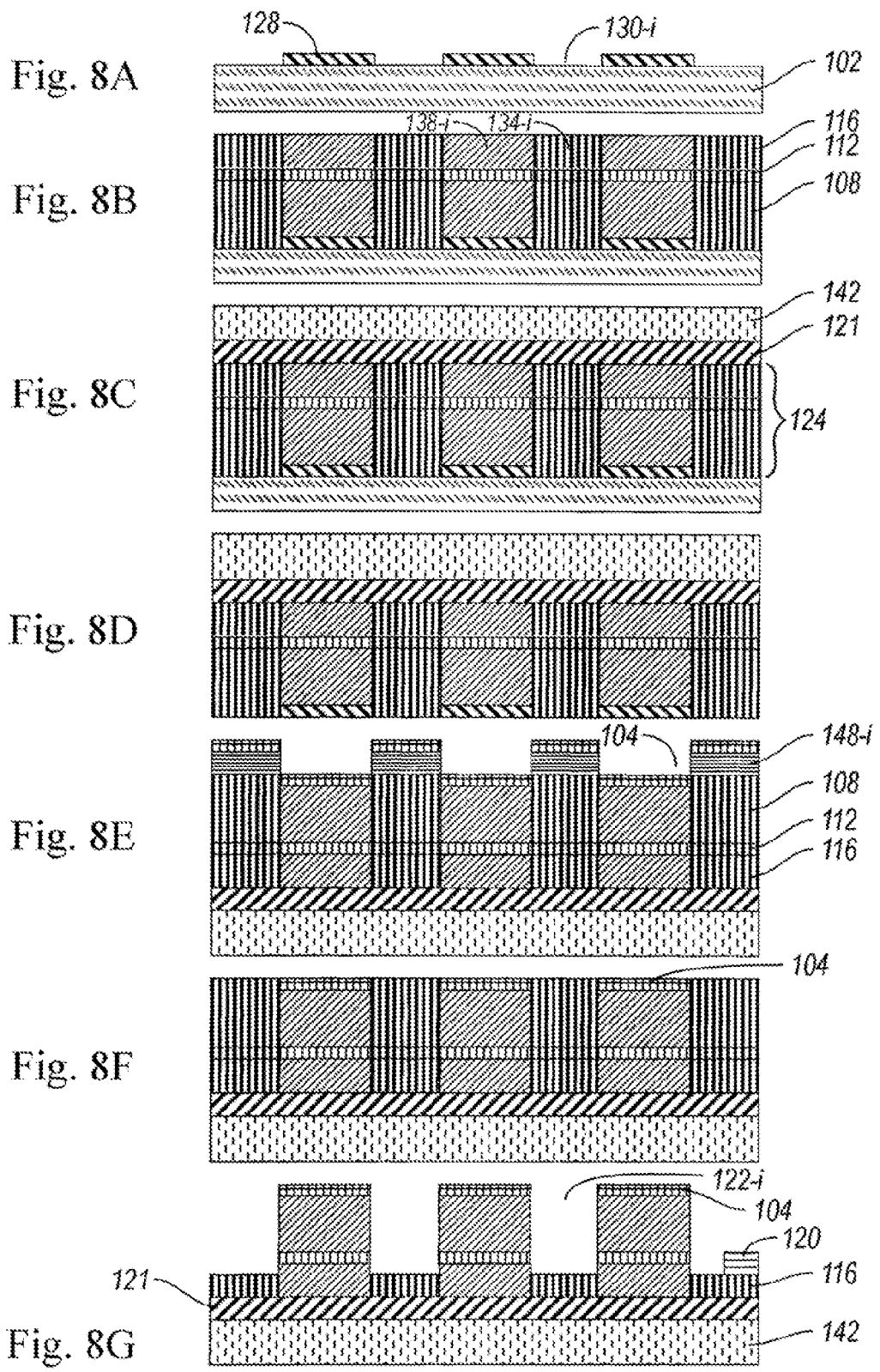

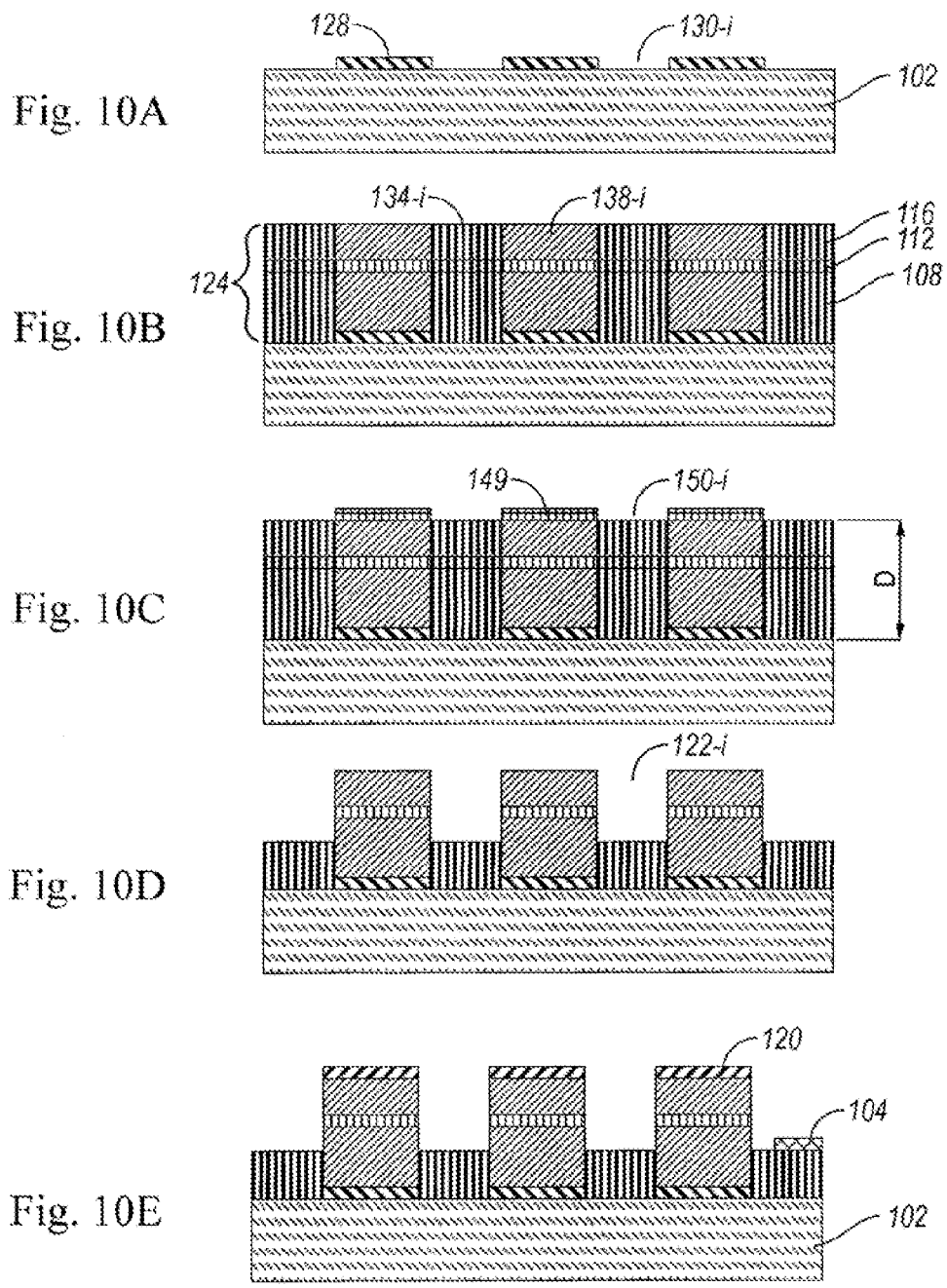

LED INCLUDING PHOTONIC CRYSTAL STRUCTURE

CROSS-REFERENCE TO RELATED APPLICATIONS

This application is a division of application Ser. No. 10/059,588, filed Jan. 28, 2002 and incorporated herein by reference.

BACKGROUND

1. Field of Invention

The present invention relates to light emitting diodes, more particularly to light emitting diodes with a photonic crystal structure.

2. Description of Related Art

Light emitting diodes ("LEDs") are technologically and economically advantageous solid state light sources. LEDs are capable of reliably providing light with high brightness, hence in the past decades they have come to play a critical role in numerous applications, including flat-panel displays, traffic lights, and optical communications. An LED includes a forward biased p-n junction. When driven by a current, electrons and holes are injected into the junction region, where they recombine, releasing their energy by emitting photons. The quality of an LED can be characterized, for example, by its extraction efficiency that measures the intensity of the emitted light for a given number of photons generated within the LED chip. The extraction efficiency is limited, among others, by the emitted photons suffering multiple total internal reflections at the walls of the high refractive index semiconductor medium. As a result, the emitted photons do not escape into free space, leading to poor extraction efficiencies, typically less than 30%.

In the past thirty years, various approaches have been proposed to enhance the extraction efficiency of LEDs. The extraction efficiency can be increased, for example, by enlarging the spatial angle in which the emitted photons can escape by developing suitable geometries, including cubic, cylindrical, pyramidal, and dome like shapes. However, none of these geometries can entirely eliminate losses from total reflection.

A further source of loss is the reflection caused by the refractive index mismatch between the LED and the surrounding media. While such losses could be reduced with an anti-reflection coating, complete cancellation of reflection can be achieved only at a specific photon energy and one angle of incidence.

U.S. Pat. No. 5,955,749, entitled "Light Emitting Device Utilizing a Periodic Dielectric Structure," granted to J. Joannopoulos et al., describes an approach to the problem of enhancing the extraction efficiency. According to U.S. Pat. No. 5,955,749 a photonic crystal is created by forming a lattice of holes in the semiconductor layers of the light emitting diode. The lattice of holes creates a medium with a periodically modulated dielectric constant, affecting the way light propagates through the medium. The photons of the light emitting diode can be characterized by their spectrum or dispersion relation, describing the relation between the energy and the wavelength of the photons. The spectrum of a photonic crystal consists of two classes. Photons in the radiative class have energies and wavelengths that match the spectrum of photons in free space thus the radiative photons are capable of escaping from the light emitting diode. Photons in the guided class, on the other hand, have energies and wavelengths that do not match the spectrum of photons in free space; therefore, guided photons are trapped in the light emitting diode. The guided photons are analogous to the earlier described photons, suffering total internal reflections.

The spectrum of guided photons in the photonic crystal consists of energy bands, or photonic bands, separated by band gaps, in analogy with the spectrum of electrons in crystalline lattices. Guided photons with energies in the band gap cannot propagate in the photonic crystal. In contrast, the spectrum of the radiative photons is a continuum, and thus has no gap. The recombinative processes in a typical LED emit photons with a well-defined energy. If, therefore, a photonic crystal is formed in the LED such that the energy of the emitted photons falls within the band gap of the photonic crystal, then all the emitted photons are emitted as radiative photons as no guided photons can exist with such energies. As described above, since all the radiative photons are capable of escaping from the LED, this design increases the extraction efficiency of the LED.

In an effort to explore the usefulness of photonic crystals for light generation, U.S. Pat. No. 5,955,749 gives a partial description of a theoretical structure of a photonic crystal device.

U.S. Pat. No. 5,955,749 describes an n-doped layer, an active layer, and a p-doped layer, and a lattice of holes formed in these layers. However, the device of U.S. Pat. No. 5,955, 749 is not operational and therefore is not a LED. First, electrodes are not described, even though those are needed for the successful operation of a photonic crystal LED ("PXLED"). The fabrication of electrodes in regular LEDs is known in the art. However, for PXLEDs, neither the fabrication of electrodes, nor their influence on the operation of the PXLED is obvious. For example, suitably aligning the mask of the electrode layer with the lattice of holes may require new fabrication techniques. Also, electrodes are typically thought to reduce the extraction efficiency as they reflect a portion of the emitted photons back into the LED, and absorb another portion of the emitted light.

Second, U.S. Pat. No. 5,955,749 proposes fabricating photonic crystal light emitting devices from GaAs. GaAs is indeed a convenient and hence popular material to fabricate regular LEDs. However, it has a high "surface recombination velocity" of about $10^6$ cm/sec as described, for example, by S. Tiwari in "Compound Semiconductor Devices Physics," Academic Press (1992). The surface recombination velocity expresses the rate of the recombination of electrons and holes on the surface of the diode. Electrons and holes are present in the junction region of the LED, coming from the n-doped layer and the p-doped layer, respectively. When electrons and holes recombine across the semiconductor gap, the recombination energy is emitted in the form of photons and generates light. However, when electrons and holes recombine through intermediate electronic states in the gap, then the recombination energy is emitted in the form of heat instead of photons, reducing the light emission efficiency of the LED. In an ideal crystal there are no states in the gap. Also, in today's high purity semiconductor crystals there are very few states in the gap in the bulk material. However, on the surface of semiconductors typically there are a large number of surface states and defect states, many of them in the gap. Therefore, a large fraction of electrons and holes that are close to the surface will recombine through these surface and defect states. This surface recombination generates heat instead of light, considerably reducing the efficiency of the LED.

This problem does not result in a serious loss of efficiency for regular LED structures. However, PXLEDs include a large number of holes, thus PXLEDs have a much larger surface area than the regular LEDs. Therefore, the surface recombination may be capable of reducing the efficiency of the PXLED below the efficiency of the same LED without the photonic crystal structure, making the formation of photonic crystal structure pointless. Since GaAs has a high surface recombination velocity, it is not a promising candidate for fabricating photonic crystal LEDs. The seriousness of the problem is reflected by the fact that so far, to Applicants' knowledge, no operating LED with a photonic crystal near the active region has been reported in the literature that uses GaAs and claims an enhanced extraction, or internal, efficiency. In particular, U.S. Pat. No. 5,955,749 does not describe the successful operation of a photonic crystal LED. Also, U.S. Pat. No. 5,955,749 does not describe the influence of the photonic crystal on the emission process, which can affect the internal efficiency of the LED.

While photonic crystals are promising for light extraction for the reasons described above, there are problems with the design. There are several publications describing experiments on a lattice of holes having been formed in a slab of a semiconductor. An enhancement of the extraction rate at photon energies in the bandgap has been reported by R. K. Lee et al. in "Modified Spontaneous Emission From a Two-dimensional Photonic Bandgap Crystal Slab," in the Journal of the Optical Society of America B, vol. 17, page 1438 (2000). Lee et al. not only shows the extraction benefits of a photonic crystal in a light emitting design, but also shows that the photonic lattice can influence the spontaneous emission. However, Lee et al. do not show how to form and operate a light emitting device with this design. A photonic crystal LED can be formed from Lee et al.'s light emitting design by including electrodes. The addition of the electrodes, however, will substantially affect the extraction and the spontaneous emission. Since this effect is unknown, it cannot be disregarded in the design of a LED. Since the Lee et al. design does not include such electrodes, the overall characteristics of an LED, formed from that design, are unclear. This questions the usefulness of the design of Lee et al.

Therefore, there is a need for new designs to create operational photonic crystal LEDs. This need includes the introduction of new materials that have sufficiently low surface recombination velocities. The need also extends to designs that counteract predicted negative effects, such as reduced spontaneous emission rates and reflection by electrodes. Finally, there is a need for describing techniques for the fabrication of photonic crystal LEDs, including fabricating electrodes.

SUMMARY

According to the invention a photonic crystal light emitting diode is provided. The PXLED includes an n-doped layer, a light emitting active layer, a p-doped layer, and electrodes for the n-doped and p-doped layers. A photonic crystal is formed as a periodic structure in the active layer, or in one of the doped layers, extending distances that are close to, or through, the active layer. In one embodiment the periodic structure is a two dimensional lattice of holes. The holes can have circular, square or hexagonal cross sections. The holes can be filled with air or with a dielectric. In another embodiment the periodic structure is periodic in only one dimension, an example of which is a set of parallel grooves. In another embodiment the dielectric constant of the PXLED can vary in one or two directions within the plane of the semiconductor layers. In another embodiment the thickness of the selected layers can vary in one or two directions within the plane of the semiconductor layers.

The parameters characterizing the lattice of the holes, include the lattice constant, the diameter of the holes, the depth of the holes, and the dielectric constant of the dielectric in the holes. In some embodiments these parameters are chosen such that the wavelength of the emitted light lies close to the edge of the energy bands of the photonic crystal, because close to the band edge the density of states of the photons is large. The recombination energy can be emitted much more efficiently through photons with a large density of states. Therefore, in embodiments of the present invention that emit light with energies close to the band edge, the emitted power can exceed the power emitted by the same LED without the periodic structure up to about eight times. This enhancement can be related to the presence of metal electrode layers in embodiments of the invention that enhance the efficiency and increase the emitted power of the PXLEDs.

The present embodiments are formed from III-Nitride compounds, which include Nitrogen and a group III element, such as Gallium, Aluminum, or Indium. III-Nitride compounds are used because their surface recombination velocities are more than ten times smaller than that of GaAs, according to M. Boroditsky et al., in J. App. Phys. vol. 87, p. 3497 (2000). As described above, a low surface recombination velocity can increase the efficiency of a PXLED above the efficiency of a regular LED without the photonic crystal structure, making GaN PXLEDs technically and economically viable candidates for improved light generation efficiency.

Additionally, GaN LEDs are the leading candidates for generating light in the blue and green regime of the spectrum; therefore, increasing their efficiency is highly desired. Finally, since the external quantum efficiency of GaN LEDs is often in the vicinity of 10 percent, the formation of photonic crystals can improve the efficiency of a GaN LED in a substantial manner. Here the external quantum efficiency is the product of the internal quantum efficiency and the extraction efficiency.

The new structure of PXLEDs uses novel fabrication techniques. Some methods of the invention create a PXLED by forming an n-doped layer, an active layer overlying the n-doped layer, a p-doped layer overlying the active layer, and a p-electrode layer overlying the p-doped layer. In some embodiments, the n-doped layer, the active layer, and the p-doped layer can include one or more layers. Next, a patterned masking layer is formed with openings, overlying the p-doped layer. Through the openings of the masking layer the p-electrode layer and the underlying semiconductor layers are removed to form a lattice of holes with suitably chosen cross sections. Finally, the masking layer is removed, and an n-electrode layer is deposited on the n-doped layer.

Some methods of the invention create a PXLED by forming a patterned masking layer with openings on a substrate. Then the epitaxial lateral overgrowth technique ("ELOG") is used to form an n-doped layer overlying the masking layer, an active layer overlying the n-doped layer, a p-doped layer overlying the active layer, and a p-electrode layer on the p-doped layer. The ELOG technique creates semiconductor layers with a low density of defects, improving the performance and reliability of the PXLEDs. A second substrate is formed on the electrode layer and the first substrate is removed to expose the masking layer. Next, the semiconductor layers are at least partially removed through the openings of the masking layer to form a lattice of holes. Finally, the masking layer is used as the p-electrode layer, and an n-electrode layer is formed on the n-doped layer.

Some methods of the invention create a PXLED by forming a first masking layer on a substrate. Then the epitaxial lateral overgrowth technique is used to form an n-doped layer overlying the masking layer, an active layer overlying the n-doped layer, and a p-doped layer overlying the active layer. Next, the Talbot effect is used to form a second patterned masking layer overlying the p-doped layer, utilizing the diffraction of light across the openings of the first masking layer. Next, the semiconductor layers are at least partially removed through the openings of the first masking layer to form a lattice of holes. Finally, electrode layers are formed for both the n-doped layer and the p-doped layer.

BRIEF DESCRIPTION OF DRAWINGS

FIGS. 6A-E illustrate steps of a method for making a photonic crystal light emitting diode.

FIGS. 8A-G illustrate steps of another method for making a photonic crystal light emitting diode.

FIGS. 10A-E illustrate steps of another method for making a photonic crystal light emitting diode.

DETAILED DESCRIPTION

Figure 1:
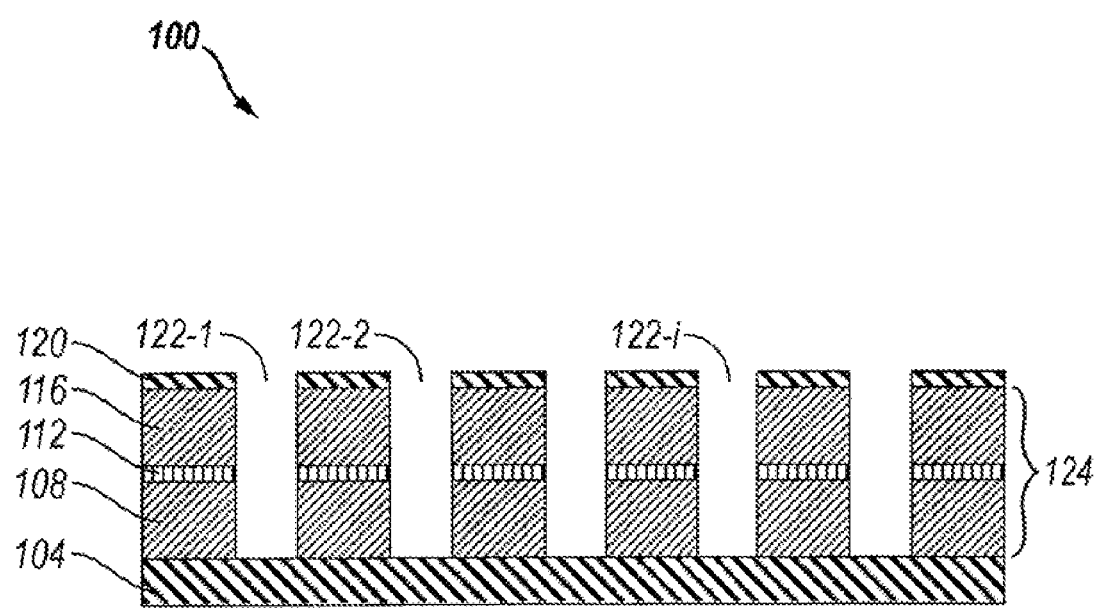
FIG. 1 illustrates a side view of an embodiment of a photonic crystal light emitting diode.

FIG. 1 illustrates an embodiment of a photonic crystal LED ("PXLED") 100. A first electrode layer 104 is formed from a thick and substantially reflective metal. In some embodiments first electrode layer 104 also serves as a substrate. In some embodiments first electrode layer 104 can overlie a substrate. Many different metals can be used for forming first electrode layer 104, including Au, Al, Ag, and heavily doped semiconductors. An n-doped layer 108 overlies first electrode layer 104. An active layer 112 overlies n-doped layer 108. A p-doped layer 116 overlies active layer 112. Finally, a second electrode layer 120 overlies p-doped layer 116. Semiconductor layers 108, 112, and 116 are often referred to as epi-layers 124. Throughout the present application the term "layer" can refer to either a single semiconductor layer or a multi-layer structure, where the individual layers of the multi-layer differ in dopant concentration, alloy composition, or some other physical characteristics.

Active layer 112 includes the junction region where the electrons of n-doped layer 108 recombine with the holes of p-doped layer 116 and emit the energy of recombination in the form of photons. Active layer 112 may include a quantum well structure to optimize the generation of photons. Many different quantum well structures have been described in the literature, for example, by G. B. Stringfellow and M. George Crawford in "High Brightness Light Emitting Diodes," published by the Associated Press in 1997.

The photonic crystal of the PXLED is created by forming a periodic structure in the LED. The periodic structure can include a periodic variation of the thickness of p-doped layer 116, with alternating maxima and minima. An example is a planar lattice of holes 122-$i$, where the integer i indexes the holes. In the present embodiment holes 122-$i$ are through holes, formed in n-doped layer 108, in active layer 112, and in p-doped layer 116. In some embodiments holes 122-$i$ are formed in p-doped layer 116 and active layer 112. In some embodiments holes 122-$i$ are formed only in p-doped layer 116, extending to the proximity of active layer 112. For example, holes 122-$i$ can extend to within one wavelength of the emitted light—in the p-doped layer 116—from active layer 112. In some embodiments the ratio of the period of the periodic structure and the wavelength of the emitted light—in air—lies in the range of about 0.1 to about 5. In embodiments, with period—to—wavelength ratios in the 0.1 to 5 range, the formation of the photonic crystal may significantly influence the efficiency of PXLED 100.

Holes 122-$i$ can have circular, square, hexagonal, and several other types of cross sections. Also, holes 122-$i$ can be filled with air or with a dielectric of dielectric constant $\in_h$, differing from the dielectric constant of epi-layers 124. Possible dielectrics include silicon oxide.

Figure 2:
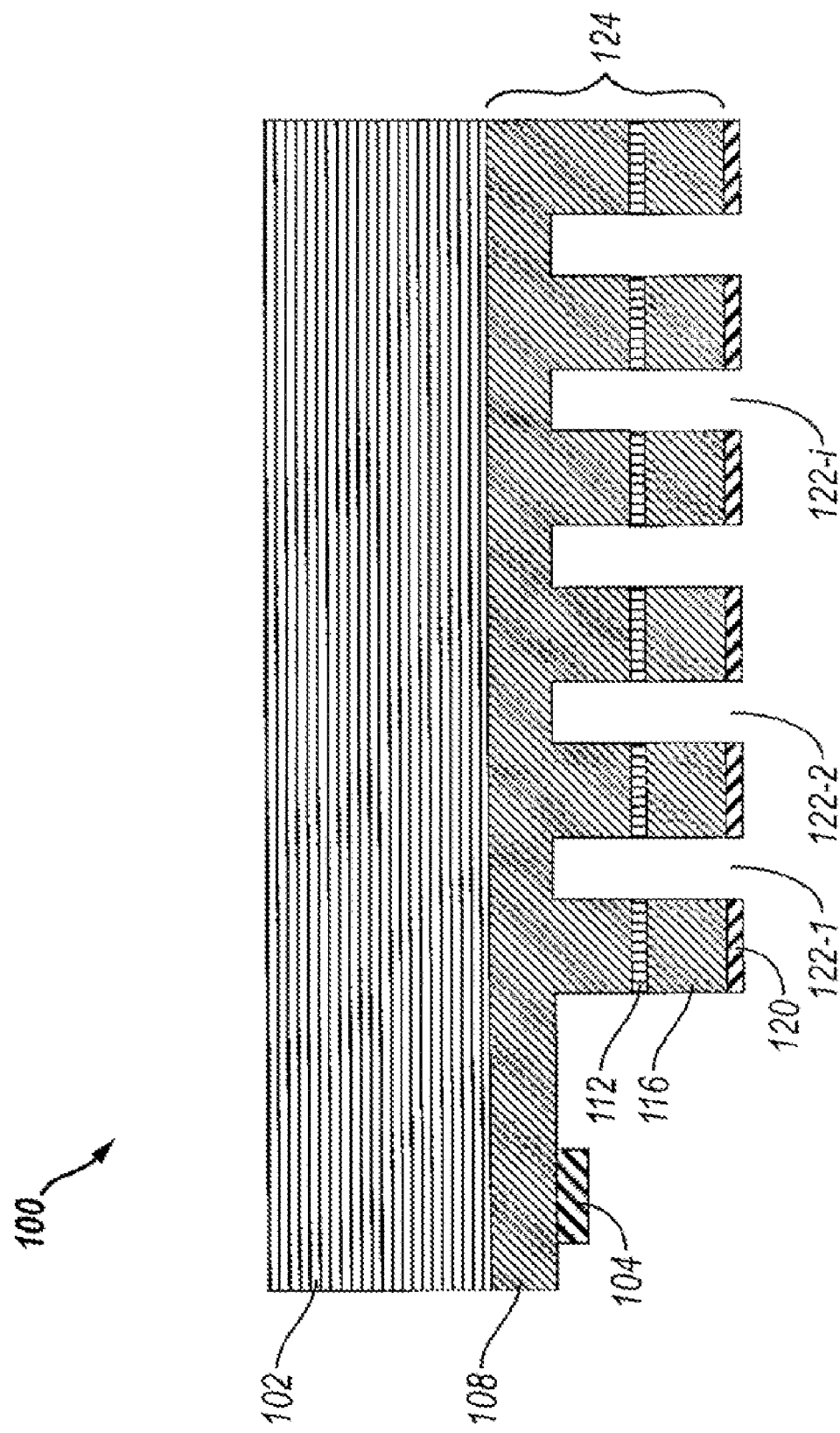
FIG. 2 illustrates a side view of another embodiment of a photonic crystal light emitting diode.

FIG. 2 illustrates another embodiment of the invention. PXLED 100 is formed on host substrate 102, n-doped layer 108 overlying host substrate 102, active layer 112 overlying n-doped layer 108, p-doped layer 116 overlying active layer 112, and second electrode layer 120 overlying p-doped layer 116. In this embodiment n-electrode layer 104 is formed overlying an area of n-doped layer 108 away from the photonic crystal, making the fabrication of n-electrode layer 104 technologically simple. The fabrication of such embodiments is described, for example, in U. S. Pat. No. 6,307,218 B1, "Electrode Structures of Light Emitting Devices," by D. Steigerwald et al., hereby incorporated in its entirety by this reference.

Figure 3:
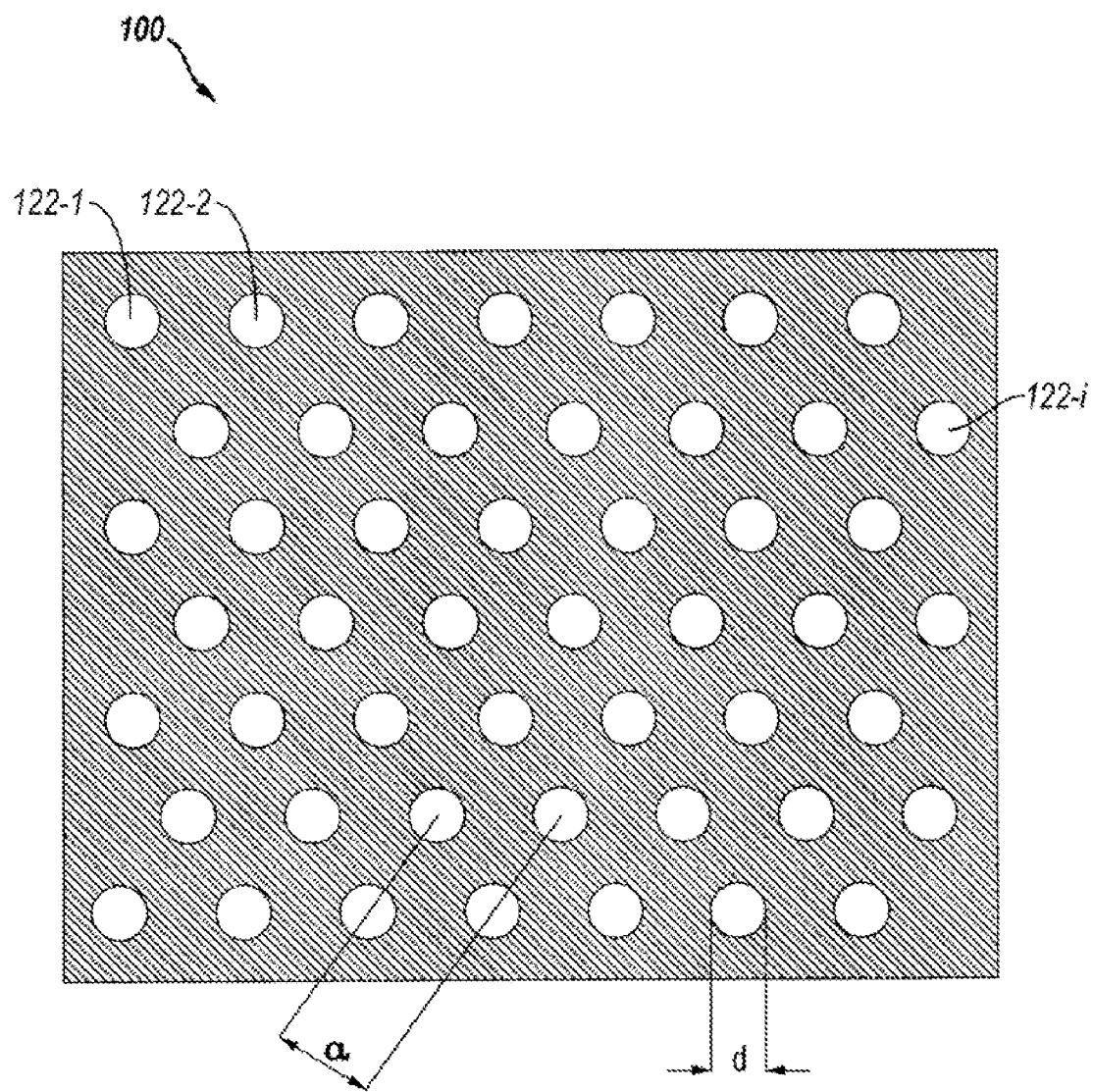
FIG. 3 illustrates a top view of an embodiment of a photonic crystal light emitting diode.

FIG. 3 illustrates a photonic crystal structure, formed as a triangular lattice of holes 122-$i$. The lattice is characterized by the diameter of holes 122-$i$, $d$, the lattice constant a, which measures the distance between the centers of nearest neighbor holes, the depth of the holes w (shown e.g. in FIG. 1), and the dielectric constant of the dielectric, disposed in the holes, $\in_h$. The PXLED parameters a, d, w, and $\in_h$ influence the density of states of the bands, and in particular, the density of states at the band edges of the photonic crystal's spectrum.

The lattice structure of the lattice of holes 122-$i$ also influences the efficiency. In various embodiments, holes 122-$i$ form square, hexagonal, honeycomb, and other well-known two-dimensional lattices.

Figure 4:
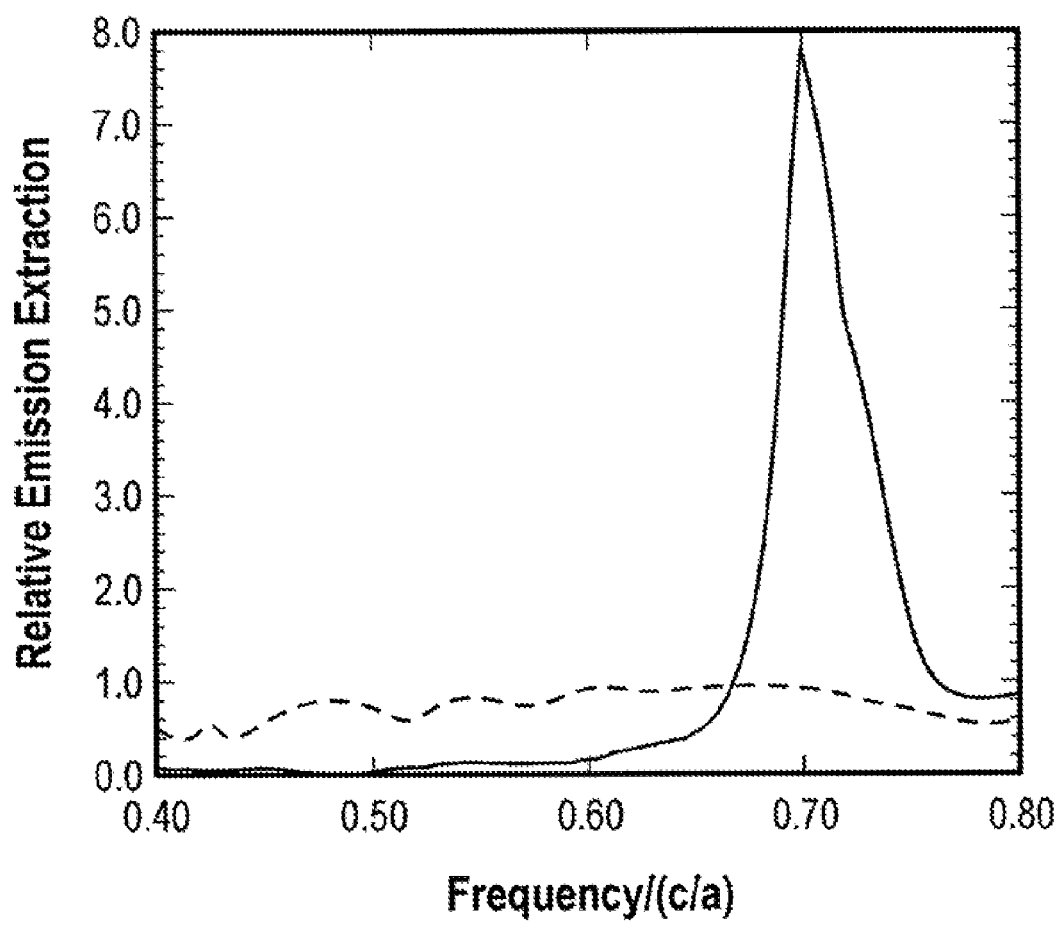
FIG. 4 illustrates the relative emission (solid line) and extraction efficiency (dashed line) for the embodiment of FIG. 1 as a function of a normalized frequency.

FIG. 4 illustrates the efficiency of a particular embodiment of FIG. 1. While the efficiency indicators will be described in relation to a particular embodiment of FIG. 1, in analogous embodiments the efficiency indicators demonstrate analogous behavior. In this particular embodiment of FIG. 1 epi-layers 124 are made from AlGaInN, with a suitably chosen alloying stoichiometry of the elements Al, Ga, In, and N. N-doped layer 108 is doped with silicon and p-doped layer 116 is doped with magnesium. N-doped layer 108 and p-doped layer 116 are designed for efficient carrier injection into active layer 112. Active layer 112 includes InGaN layers, forming quantum wells, sandwiched between n-type InGaN layers with lower In concentration. The wavelength $\lambda$ of the emitted light can be tuned by suitably choosing the In concentration and thickness of the quantum wells. First and second electrode layers 104 and 120 are formed of highly reflective and low loss materials, including Ag, Al, and Au based electrode materials. The lattice is a triangular lattice as shown in FIG. 3. The total thickness of epi-layers 124 are between 0.375 a and 2 a and the hole diameter d is 0.72 a. The first electrode 104 has a thickness of a, or greater, and the second electrode 120 has a thickness of 0.03 a. The location of the active layer 112 is 0.0625 a away from the center of epi-layers 124, closer to first electrode layer 104. The efficiency of PXLED 100 is sensitive to the location of active layer 112.

FIG. 4 illustrates two indicators of the efficiency of the above particular embodiment of FIG. 1. The solid line indicates the relative emission, while the dashed line indicates the extraction efficiency. The relative emission is defined as the ratio of the total power emitted in the form of light by an LED with a photonic crystal structure, divided by the total power emitted by the same LED, but without the periodic structure. The efficiency indicators are shown in FIG. 4 as a function of the photon frequency v, normalized by c/a, wherein c is the speed of light—in air—and a is the lattice spacing. The photon frequency v and the photon energy E are related through the well-known relation: E=hv, where h is Planck's constant. As illustrated in FIG. 4, the relative emission shows a maximum in the vicinity of the value v/(c/a)=0.70. The relative emission of PXLED 100 is approximately eight times larger at the maximum compared to the relative emission of the same LED, but without the photonic crystal structure. The extraction efficiency of PXLED 100 is relatively flat as a function of the frequency. The total efficiency of PXLED 100 is proportional to the product of these quantities, clearly showing that forming a photonic crystal in an LED enhances the total efficiency and thus the emitted power, if the parameters of PXLED 100 are chosen suitably.

In this embodiment the lattice is designed so that a maximum of the relative emission, and thus the total efficiency, occurs at or near the frequency of the emitted light. In the embodiment of FIG. 4 the maximum of the relative emission occurs around the frequency of v=0.7(c/a). Therefore, in a PXLED where the active layer emits light with wavelength λ, a local maximum of the relative emission will substantially coincide with the frequency of the emitted light, if the lattice spacing of the photonic crystal a is about 0.7λ. Here the relation λv=c has been used to connect the wavelength λ and the frequency v. For example, if the wavelength of the emitted light λ is 530 nm, then the lattice spacing a is 371 nm.

The analysis of the band structure and the corresponding density of states reveal that the above enhancement of the power occurs at energies close to the band edge. The density of the photons is large close to the band edge. The rate of spontaneous emission is proportional to the density of states. Thus, a large density of states enhances the rate of spontaneous emission. Therefore, embodiments are designed so that the energy of the emitted light lies close to the band edge, thus enhancing the efficiency of the PXLED. Furthermore, the PXLED parameters a, d, w, and $λ_h$, and the design of the electrode layers can be selected to enhance the extraction efficiency as well, maximizing the total efficiency of the PXLED. The efficiency of the PXLED shows significant sensitivity to the presence and design of the electrode layers.

In other embodiments typical values of the lattice spacing a lie between about 0.1λ and about 10λ, preferably between about 0.1λ and about 4λ. Typical values for the hole diameter d lie between about 0.1 a and about 0.5 a. Typical values of the depth of the hole w lie between zero and the full thickness of epi-layers 124. Finally, $\in_h$ typically lies between 1 and about 16.

In embodiments, where epi-layers 124 have a total thickness of about 2 a or higher, the maximum value of the relative emission is 2-3 fold smaller. In these embodiments the maximum value is less sensitive to the presence or absence of electrode layers 104 and 120.

In embodiments, where the electrode layers have substantial dissipative properties, such as a substantial imaginary part of the refractive index n, the design parameters may differ considerably from the above-described values. The efficiency of the emission depends on the polarization of the emitted light. However, PXLEDs with a honeycomb lattice of holes are capable of emitting light with an emission efficiency that is polarization insensitive.

Figure 5A:
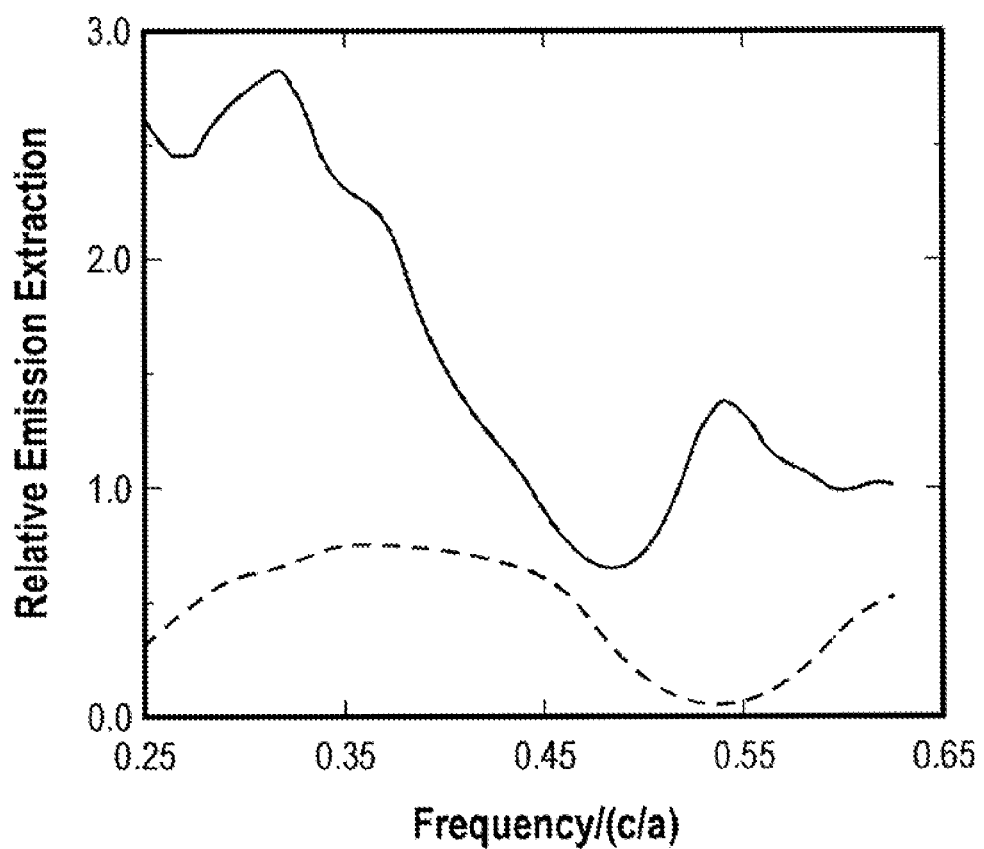
FIG. 5A illustrates the relative emission (solid line) and extraction efficiency (dashed line) for the embodiment of FIG. 2 as a function of a normalized frequency.

FIG. 5A shows the two indicators of the efficiency of the embodiment of FIG. 2. While the efficiency indicators will be described in relation to a particular embodiment of FIG. 2, in analogous embodiments the efficiency indicators demonstrate analogous behavior. In the embodiment of FIG. 2, epi-layers 124 are only partially removed in holes 122-i. The depth of holes 122-i is 2 a in this particular embodiment. In this particular embodiment of FIG. 3, the total thickness of epi-layers 124 is greater than about 2 a, for example 6 a. The air-filled holes have a diameter d of about 0.72 a, and the depth of the holes is about 2 a. Similar results hold for hole diameters lying in the range of about 0.3 a and about a. Second electrode layer 120 has a thickness of about 0.09 a, and active layer 112 is formed with a thickness of about 0.5 a.

FIG. 5A illustrates two indicators of the efficiency of the above particular embodiment of FIG. 2. Again, the solid line indicates the relative emission, while the dashed line indicates the extraction efficiency. In analogy with FIG. 4, the relative emission shows an enhancement with a maximum of about 2.7 at a frequency of about v=0.325(c/a). Furthermore, in this embodiment the extraction rate also varies as a function of the frequency, unlike in FIG. 4. In particular, the extraction rate exhibits broad maxima in the 0.3(c/a) to 0.45 (c/a) range, and around 0.65(c/a).

Figure 5B:
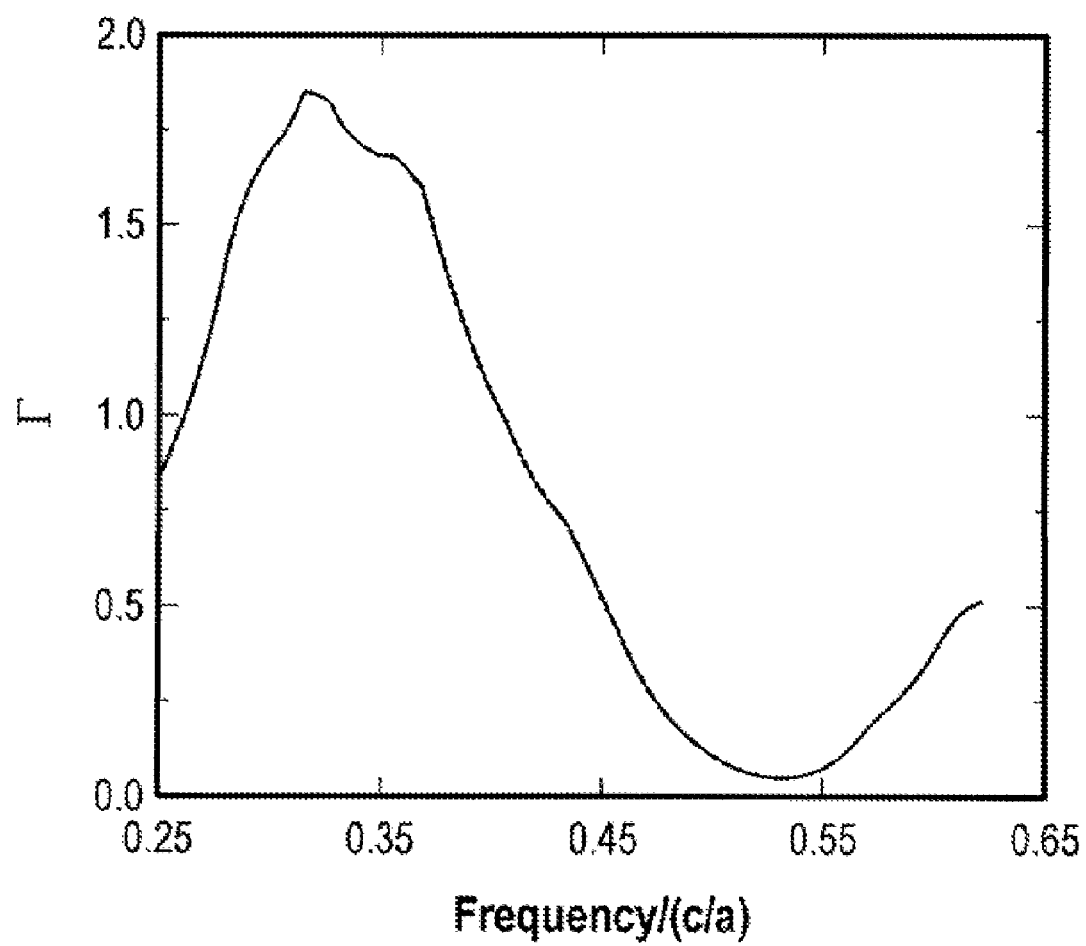
FIG. 5B illustrates the product of the relative emission and the extraction efficiency as a function of a normalized frequency.

FIG. 5B illustrates the product of the extraction efficiency and the relative emission, the two quantities shown in FIG. 5A. As mentioned before, the total efficiency of the PXLED is proportional to this product. As demonstrated by FIG. 5B, the emitted power of this embodiment is once again greater than that of the corresponding LED without the photonic crystal structure.

According to FIG. 5B, the total efficiency shows maxima at the normalized frequencies of about v=0.325(c/a) and about v=0.63(c/a). Therefore, in a PXLED where the active layer emits light with wavelength A, local maxima of the relative emission will substantially coincide with the frequency of the emitted light, if the lattice spacing of the photonic crystal a is about a=0.325λ or about a=0.63λ. Here again the relation λv=c has been used to connect the wavelength λ and the frequency v. For example if the emitted wavelength λ is 530 nm then the lattice spacing a can be suitably chosen to be about 172 nm or about 334 nm.

Some embodiments show a resonant behavior at some frequencies. At these resonant frequencies the pattern of emission can be different from the emission at other frequencies. For example, in the vicinity of the frequency v/(c/a) =0.54 the embodiment of FIG. 2 radiates its power mostly towards the second electrode layer instead of the first electrode layer, resulting in a minimum of the extraction efficiency. The existence of this minimum once again underscores the importance of the electrode layers. This effect can be used to design PXLEDs that emit a large fraction of the generated light into a selected direction.

In embodiments, where the electrode layers 104 and 120 have substantial dissipative properties, such as a substantial imaginary part of the refractive index n, the design parameters may differ considerably from the above-described values.

The periodic structure can be made three-dimensional by creating a variation of the dielectric constant of one or more selected semiconductor layers in the direction normal to the plane of the layers besides the already formed two-dimensional periodic structure. This can be achieved, for example, by forming several structural layers within a selected semiconductor layer, the structural layers having two different alloy compositions in an alternating manner.

In some embodiments the periodic structure is a variation of the thickness of one or more selected semiconductor layers. The periodic structure can include variations of the thickness along one direction within the plane of the semiconductor layers, but extending along a second direction without variation, in essence forming a set of parallel grooves. Two-dimensional periodic variations of the thickness include various lattices of indentations.

While the present embodiment and further embodiments below are described having an n-doped layer deposited first and a p-doped layer formed overlying the n-doped layer, LEDs with the opposite architecture, where a p-doped layer is deposited first and an n-doped layer is formed overlying the p-doped layer, are also understood to be within the scope of the invention.

As explained above, semiconductors with low surface recombination velocities are promising candidates for forming PXLEDs. Electrons and holes recombining on the surface via mid-gap states release their energy in the form of heat instead of light. Therefore, the surface acts as a current sink, reducing the efficiency of PXLEDs. The reduction of efficiency is high in PXLEDS formed from semiconductors with high surface recombination velocities, such as GaAs. In fact, the efficiency of GaAs PXLEDs can be reduced below the efficiency of GaAs LEDs with the same architecture, but without the photonic crystal structure. For this reason, fabricating PXLEDs from GaAs does not offer significant advantages.

In contrast, forming a photonic crystal structure in GaN LEDs can significantly increase the efficiency of the GaN LEDs, because GaN has a much lower surface recombination velocity than GaAs.

Therefore, in embodiments of the present invention epi-layers 124 are formed from semiconductors with low surface recombination velocities. Suitable choices include III-Nitride semiconductors, formed from Nitrogen and a group III element, such as Gallium. The advantages of this choice can be appreciated by noting that the surface recombination velocity of GaAs is about $10^6$ cm/sec, whereas the surface recombination velocity of GaN is about $3 \times 10^4$ cm/sec. The low surface recombination velocity makes the surface recombination process much weaker in GaN than in GaAs. Furthermore, the diffusion length of carriers in GaN is also much smaller than in GaAs. Therefore, much fewer carriers diffuse onto to the surface in GaN than in GaAs during traversing the LED. The smallness of the number of carriers, reaching the surface by diffusion, further weakens the already weak surface recombination process.

III-Nitride LEDs can also be formed using AlGaN, InGaN or combinations thereof.

The novel structure of the PXLEDs can be fabricated in novel ways. FIGS. 6A-D illustrate a method of fabricating PXLEDs.

FIG. 6A illustrates the step of forming PXLED 100 on host substrate 102, which can be, for example, sapphire. N-doped layer 108, active layer 112, p-doped layer 116, and second electrode layer 120 are formed by usual deposition techniques. Masking layer 128 is formed overlying second electrode layer 120.

FIG. 6B illustrates the step of patterning lattice of openings 130-$i$ into masking layer 128 using a high resolution lithography technique, such as electron beam lithography, nanoimprint lithography, deep X-ray lithography, interferometric lithography, hot embossing or microcontact printing.

FIG. 6C illustrates the step of at least partially removing epi-layers 124 corresponding to lattice of openings 130-$i$ of masking layer 128. In FIG. 6C n-doped layer 108 is removed only partially. Approximately vertical walls can be achieved by using dry etching techniques. The damage caused by a dry etching can be reduced by a subsequent short wet chemical etching, annealing, a combination thereof or other surface passivation techniques.

FIG. 6D illustrates the step of removing masking layer 128. This step exposes second electrode layer 120 that can hence be used to provide electrical contact to p-doped layer 116. Finally, first electrode layer 104 is formed on a region of n-doped layer 108, from where p-doped layer 116 and active layer 112 have been removed. In some embodiments n-doped layer 108 has been partially removed as well in that region. First electrode layer 104 can be formed in a region of n-doped layer 108 that is displaced from the photonic crystal structure, making its fabrication easier. Lateral compact geometries for the formation of first electrode layer 104 have been described in U.S. Pat. No. 6,307,218 B1, "Electrode Structures of Light Emitting Devices," by D. Steigerwald et al.

In LEDs the currents flow between first electrode layer 104 and second electrode layer 120. Since in the above-described embodiments first electrode layer 104 and second electrode layer 120 are formed at horizontally removed areas, the flow of the currents includes substantially horizontal pathways.

In some embodiments host substrate 102 is a good conductor, thus first electrode layer 104 can be deposited on host substrate 102 directly. In these embodiments the pathways of the currents are substantially vertical across epi-layers 124.

Some embodiments emit most of the generated light through host substrate 102, while other embodiments emit most of the light through the side opposite to host substrate 102, sometimes referred to as the top of the LED. In substrate-emitting PXLEDs host substrate 102 is formed from a substantially transparent material and second electrode layer 120 is formed from a substantially reflective or opaque material. In top-emitting PXLEDs host substrate 102 is formed from a substantially reflective or opaque material. In some embodiments a reflective layer is deposited on host substrate 102.

FIG. 6E illustrates that in some embodiments where host substrate 102 is conductive first electrode layer 104 can be formed on the side of host substrate 102 opposite of epi-layers 124. In these embodiments the current pathways are substantially vertical across the entire PXLED 100.

FIGS. 7A-F illustrate another method of fabricating PXLEDs. This epitaxial lateral overgrowth ("ELOG") technique can be useful, for example, for III-Nitride based semiconductor structures, such as GaN-based LEDs. GaN semiconductors have an unusually large concentration of defects, including fractures and dislocations. This high defect concentration can lead to poor reliability, reduced efficiency, and diminished brightness. Many of the defects are nucleated by the surface of the growth substrate. The ELOG technique reduces the defect concentration, significantly reducing the above detrimental effects.

Figure 7A:
FIGS. 7A-F illustrate steps of another method for making a photonic crystal light emitting diode.

FIG. 7A illustrates the step of forming masking layer 128 on first substrate 102. Lattice of openings 130-i can be formed in masking layer 128 by high resolution lithographic techniques, such as electron beam lithography, nano-imprint lithography, deep X-ray lithography, interferometric lithography, hot embossing or microcontact printing.

Figure 7B:
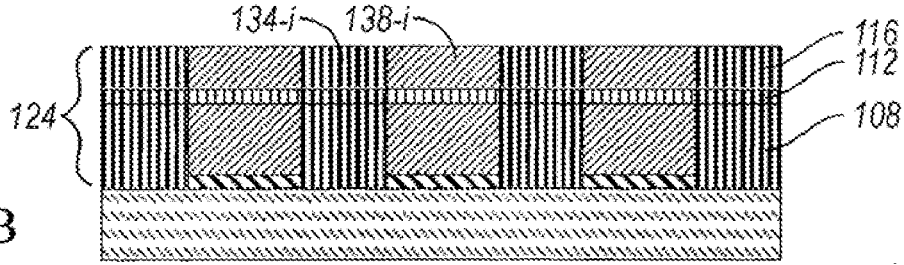

FIG. 7B illustrates the step of forming n-doped layer 108 overlying first substrate 102 and masking layer 128. Active layer 112 is formed overlying n-doped layer 108, and p-doped layer 116 is formed overlying active layer 112. A feature of the ELOG technique is that n-doped layer 108 primarily grows starting from first substrate 102 through lattice of openings 130-i. Thus, the growing n-doped layer 108 spreads out laterally into regions 138-i, rather than grow straight up from masking layer 128.

The defects are typically nucleated by first substrate 102, and hence will originate primarily in lattice of openings 130-i. As the growth of n-doped layer 108 spreads out into regions 138-i, defects and dislocations tend to turn out and annihilate one another in the overgrown region. Therefore, the defect concentration will be high in defect-rich regions 134-i directly above lattice of openings 130-i, whereas the defect concentration will be low in defect-poor regions 138-i, between lattice of openings 130-i.

Figure 7C:
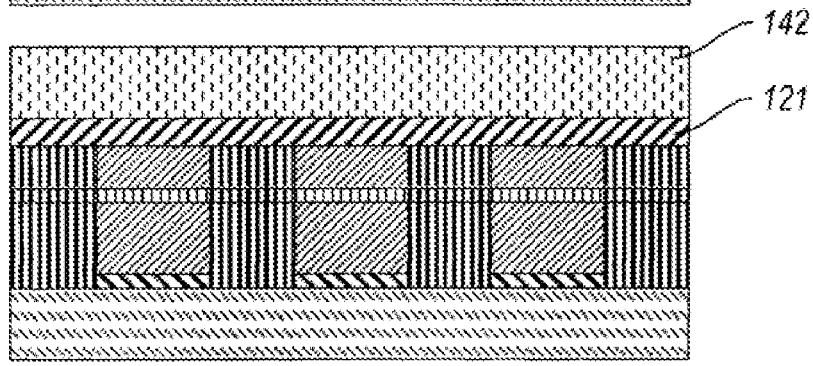

FIG. 7C illustrates the step of forming bonding layer 121 and second substrate 142 overlying p-doped layer 116. Bonding layer 121 bonds epi-layers 124 to second substrate 142.

Figure 7D:
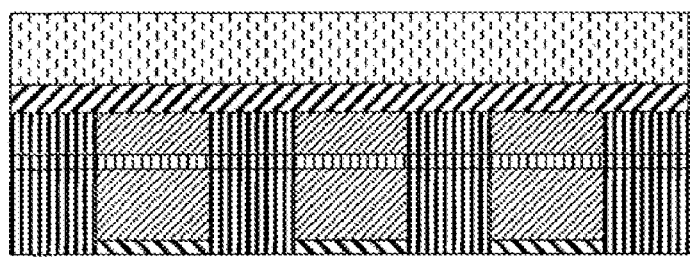

FIG. 7D illustrates the step of removing first substrate 102 from epi-layers 124 using laser lift-off, or etching techniques.

Figure 7E:
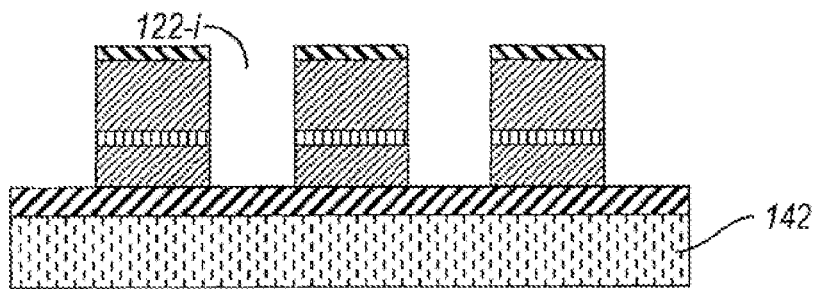

FIG. 7E illustrates the step of using masking layer 128 to form holes 122-i by an etching procedure. For example, dry etching can be used to ensure that the walls of holes 122-i are approximately vertical. The openings 130-i of masking layer 128 are aligned with defect-rich regions 134-i. Therefore, the etching step removes the regions with high defect density. Therefore, only the epi-layers 124 that were formed in the defect-poor regions 138-i are left by this etching step, yielding a PXLED 100 with low defect density and thus high quality.

Figure 7F:
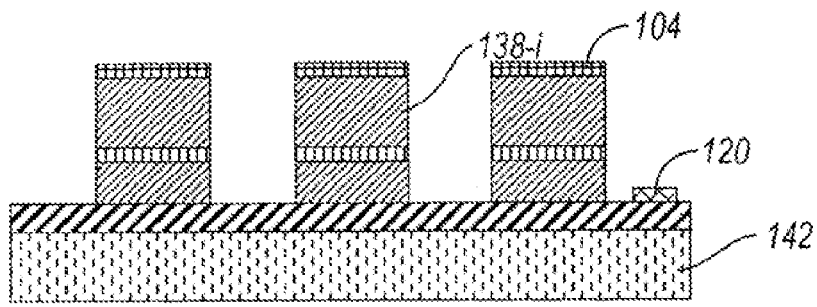

FIG. 7F illustrates the step of removing masking layer 128, and forming first electrode layer 104 on top of defect-poor regions 138-i. First electrode layer 104 can be formed, for example, by deposition from an angle. This technique minimizes the deposition of contact materials inside holes 122-i. Second electrode layer 120 can be formed at horizontally removed areas.

In some embodiments masking layer 128 itself can serve as first electrode layer 104. In these embodiments masking layer 128 is not removed.

In substrate-emitting PXLEDs bonding layer 121 is substantially transparent, formed from, for example, indium tin oxide ("ITO"). Second substrate 142 is also substantially transparent, formed from, for example, sapphire, silicon carbide or glass. First electrode layer 104 is substantially reflective or opaque, formed from, for example, Ag, Al or Au.

In top-emitting PXLEDs, at least one of bonding layer 121 and second substrate 142 are substantially reflective or opaque. Bonding layer 121 or second substrate 142 can be made reflective, for example, by forming a substantially reflective overlying layer.

FIGS. 8A-G illustrate a related method of fabricating PXLEDs. The steps shown in FIGS. 8A-D are the same as in FIGS. 7A-D.

FIG. 8E illustrates the step of forming photosensitive layer 148. The transparency of masking layer 128 is low. To capitalize on this property, a negative photosensitive layer 148 is deposited over the surface from where first substrate 102 has been removed. Negative photosensitive layer 148 is deposited over masking layer 128 and defect-rich regions 134-i. Next, light is shone through second substrate 142, reaching photosensitive layer 148 across epi-layers 124. Negative photosensitive layer 148 changes its chemical composition where it is exposed to the incident light. This change in chemical composition makes it possible to remove negative photosensitive layer 148 overlying masking layer 128, where it has not been exposed to light, while keeping it in place overlying defect-rich regions 134-i. Next, masking layer 128 s removed as well. This procedure creates a planar lattice of aligned mask-layers 148-i overlying defect-rich regions 134-i.

Next, first electrode layer 104 is deposited overlying the planar lattice of aligned mask-layers 148-i.

FIG. 8F illustrates the next step, in which first electrode layer 104 is partially removed by the lift-off of planar lattice of aligned mask-layers 148-i. This step exposes n-doped layer 108 in defect-rich regions 134-i, but still leaves n-doped layer 108 covered by first electrode layer 104 in defect-poor regions 138-i.

FIG. 8G illustrates the formation of holes 122-i by etching, which leaves first electrode layer 104 in place, but removes the exposed epi-layers 124 in defect-rich regions 138-i. First electrode layer 104 is used as an etch mask in this step. Epi-layers 124 can be removed completely or partially to form holes 122-i. In some embodiments dry etching is used to make the walls of holes 122-i approximately vertical. After this step the remaining portions of first electrode layer 104 are electrically coupled only to n-doped layer 108.

Because of the ELOG technique lattice of openings 130-i of masking layer 128 are aligned with defect-rich regions 134-i. Therefore, the etching step of FIG. 8G substantially removes defect-rich regions 134-i, substantially leaving defect-poor regions 138-i in place. Thus, LEDs created by the ELOG technique have low defect density, reducing the mentioned detrimental effects, including poor reliability, reduced efficiency, and diminished brightness.

In the next step second electrode layer 120 is formed over a region of p-doped layer 116 that is displaced from the photonic crystal structure, making its fabrication easier.

In substrate-emitting PXLEDs bonding layer 121 is substantially transparent, formed from, for example, indium tin oxide ("ITO"). Second substrate 142 is also substantially transparent, formed from, for example, sapphire, silicon carbide or glass. First electrode layer 104 is substantially reflective or opaque, formed from, for example, Ag, Al or Au.

In top-emitting PXLEDs, at least one of bonding layer 121 and second substrate 142 are substantially reflective or opaque. Bonding layer 121 or second substrate 142 can be made reflective, for example, by forming a substantially reflective overlying layer.

In some embodiments the order of deposition of n-doped layer and p-doped layer is reversed, thus layer 108 is p-doped, while layer 116 is n-doped.

FIGS. 9A-F illustrate a related method of fabricating PXLEDs. The steps, shown in FIGS. 9A-D are the same as in FIGS. 8A-D.

Figure 9A:
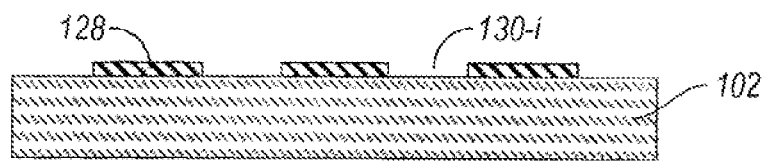
FIGS. 9A-F illustrate steps of another method for making a photonic crystal light emitting diode.
Figure 9B:
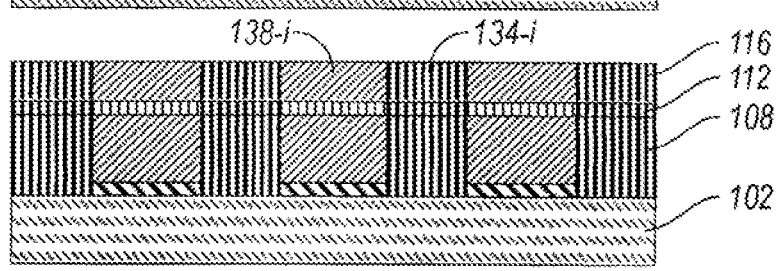
Figure 9C:
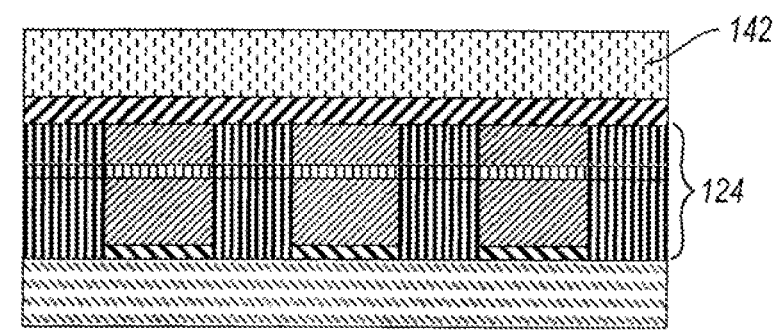
Figure 9D:
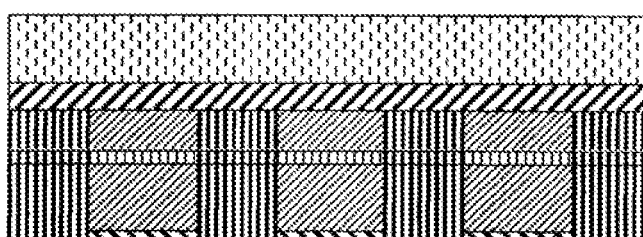
Figure 9E:
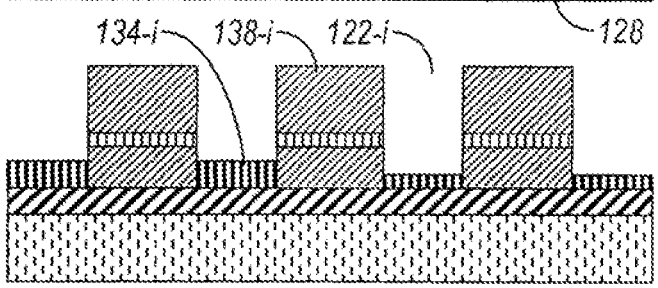

FIG. 9E illustrates the next step, in which masking layer 128 is used as an etch layer. Therefore, defect-rich regions 134-i are partially removed in this step, creating holes 122-i where lattice of openings 130-i of masking layer 128 were originally located. After the formation of holes 122-i masking layer 128 is removed. After the formation of holes 122-i, the total thickness of epi-layers 124 can be optimized by further etching or other techniques.

Figure 9F:
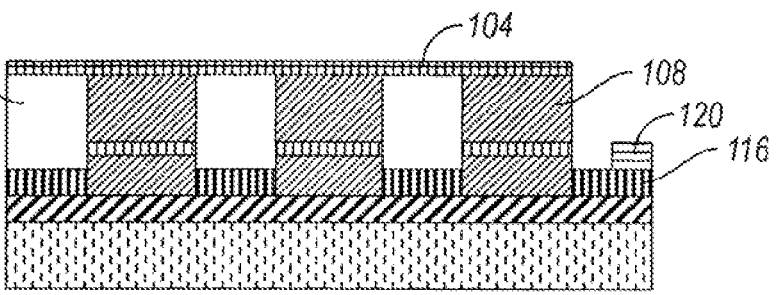

FIG. 9F illustrates the next step, in which holes 122-i are filled up with a non-conducting material 143 to make the upper surface of the device approximately flat. Non-conducting material can be, for example, a spin-on-glass ("SOG"). Then first electrode layer 104 is deposited over the approximately flat upper surface, formed by n-doped layer 108 and non-conducting material 143. By this architecture first electrode layer 104 is electrically coupled only to n-doped layer 108. Next, second electrode layer 120 is formed over a region of p-doped layer 116 that is displaced from the photonic crystal structure, making its fabrication easier. In analogy to the embodiment of FIGS. 8A-G, the PXLED fabricated by the method of FIGS. 9A-F can be a substrate-emitting or a top-emitting device.

Since in the above-described embodiments first electrode layer 104 and second electrode layer 120 are formed at horizontally removed areas, the flow of the currents includes substantially horizontal pathways.

In some embodiments second substrate 142 is a good conductor, thus second electrode layer 120 can be deposited on epi-layers 124 directly, or bonding layer 121 can act as a second electrode layer. In these embodiments the pathways of the currents are substantially vertical across epi-layers 124.

FIGS. 10A-E illustrate another method of fabricating PXLEDs. This method again utilizes the epitaxial lateral overgrowth, or ELOG, technique that can be useful, for example, for III-Nitride based semiconductor structures, such as GaN-based LEDs.

FIG. 10A illustrates the step of forming masking layer 128 on host substrate 102. Lattice of openings 130-$i$ can be formed in masking layer 128 by high resolution lithographic techniques, such as electron beam lithography, nano-imprint lithography, deep X-ray lithography, interferometric lithography, hot embossing or microcontact printing.

FIG. 10B illustrates the step of forming n-doped layer 108 overlying first substrate 102 and masking layer 128. Active layer 112 is formed overlying n-doped layer 108, and p-doped layer 116 is formed overlying active layer 112. A feature of the ELOG technique is that n-doped layer 108 primarily grows starting from first substrate 102 through lattice of openings 130-$i$. Thus, the growing n-doped layer 108 spreads out laterally into regions 138-$i$, rather than grow straight up from masking layer 128.

The defects are typically nucleated by first substrate 102, and hence will originate primarily in lattice of openings 130-$i$. As the growth of n-doped layer 108 spreads out into regions 138-$i$, the defects and dislocations tend to turn out and annihilate one another in the overgrown region. Therefore, the defect concentration will be high in defect-rich regions 134-$i$ directly above lattice of openings 130-$i$, whereas the defect concentration will be low in defect-poor regions 138-$i$, between lattice of openings 130-$i$.

FIG. 10C illustrates the step of aligning the openings of a masking layer with defect-rich regions 134-$i$. The method utilizes the Talbot effect, described by W. H. F. Talbot in "Facts relating to optical science, No. IV," Philosophical Magazine, vol. 9, p. 401-407, published by Taylor and Francis in 1836.

According to the Talbot effect, periodic structures of period length a form images of themselves at integer multiples of the distance $D=2\ a^2/\lambda$ through Fresnel diffraction, when illuminated by a coherent light with a planar wave front, having a wavelength $\lambda$ in the material.

In order to make use of the Talbot effect, the thickness of epi-layers 124 is chosen to be D, or an integer multiple of D. Further, substrate 102 is formed from a substantially transparent material, and masking layer is formed from a substantially non-transparent material. Also, a photosensitive layer 149 is deposited overlying p-doped layer 116. The Talbot effect is utilized by perpendicularly shining a light with a planar wave front at the side of substrate 102 opposite to epi-layers 124. Only that part of the light will enter epi-layers 124, which was incident at lattice of openings 130-$i$. The light, propagating through lattice of openings 130-$i$, creates the image of the lattice of openings 130-$i$ at a distance D because of the Talbot effect. Thus, photosensitive layer 149 will be exposed to the image of lattice of openings 130-$i$. The exposed regions of photosensitive layer 149 are removed in a subsequent step to create aligned openings 150-$i$. The Talbot effect can be achieved in the present embodiment, for example, by using a near collimated light source.

FIG. 10D illustrates the step of using aligned openings for forming holes 122-$i$. For example, dry etching can be used to ensure that the walls of holes 122-$i$ will be approximately vertical. By virtue of the Talbot effect aligned openings 150-$i$ are aligned with defect-rich regions 134-$i$. Therefore, the etching step removed defect-rich regions 134-$i$, so that the remaining epi-layers 124 substantially consist of defect-poor regions 138-$i$. Therefore, PXLEDs created by this technique will have low defect density. After the etching step, photosensitive layer 149 is removed.

FIG. 10E illustrates the step of forming first electrode layer 104 overlying n-doped layer 108, and second electrode layer 120 overlying p-doped layer 116. First electrode layer 104 is formed over a region of n-doped layer 108 that is displaced from the photonic crystal structure, making its fabrication easier. Second electrode layer 120 is formed can be formed, for example, by deposition from an angle. This technique minimizes the deposition of contact materials inside holes 122-$i$.

Figure 11A:
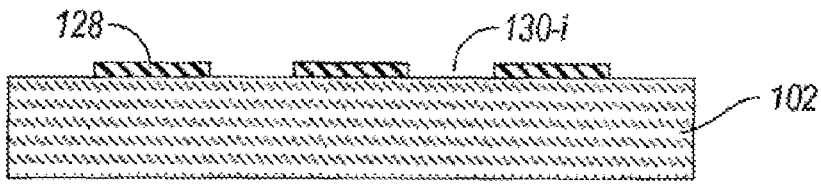
FIGS. 11A-E illustrate steps of another method for making a photonic crystal light emitting diode.
Figure 11B:
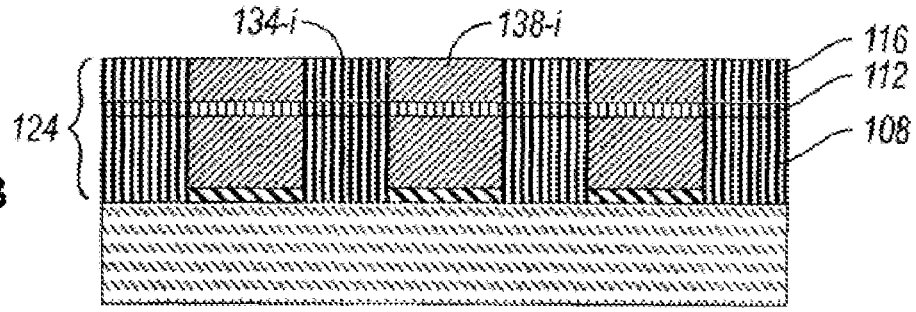

FIGS. 11A-E illustrate a method, related to the method of FIGS. 10A-E. The steps of FIGS. 11A and 11B are the same as the steps of FIGS. 10A and 10B.

Figure 11C:
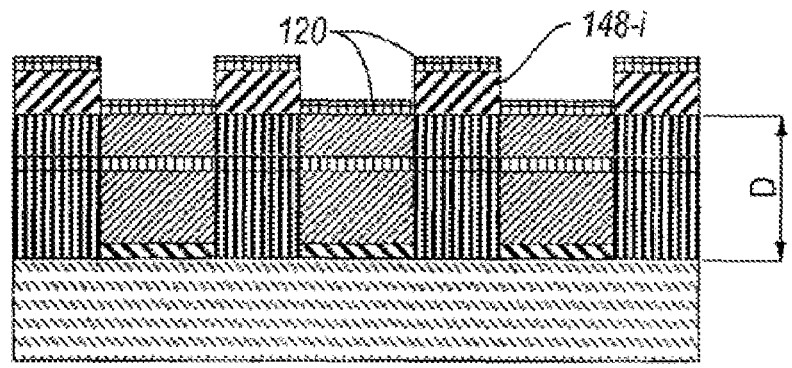

FIG. 11C illustrates a different way of utilizing the Talbot effect. The thickness of epi-layers 124 is chosen to be D, or an integer multiple of D. Further, substrate 102 is formed from a substantially transparent material, and masking layer 128 is formed from a substantially non-transparent material. Also, a negative photosensitive layer is deposited overlying p-doped layer 116. The Talbot effect is utilized by perpendicularly shining a light with a planar wave front at the side of substrate 102 opposite to epi-layers 124. Only that part of the light will enter epi-layers 124, which was incident at lattice of openings 130-$i$. The light, propagating through lattice of openings 130-$i$, creates the image of the lattice of openings 130-$i$ at a distance D because of the Talbot effect. Thus, the photosensitive layer will be exposed to the image of lattice of openings 130-$i$. The non-exposed regions of the photosensitive layer are removed in a subsequent step to create aligned mask-layers 148-$i$. The Talbot effect can be achieved in the present embodiment, for example, by using a near collimated light source.

Next, second electrode layer 120 is formed overlying p-doped layer 116 and the photosensitive layer.

Figure 11D:
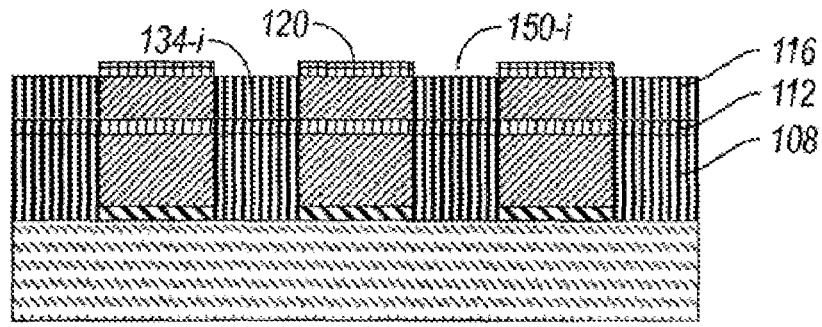

FIG. 11D illustrates the step of forming aligned openings 150-$i$ by a lift-off technique. Aligned mask-layers 148-$i$ are removed, together with the corresponding portions of second electrode layer 120 to expose p-doped layer 116 in defect-rich regions 134-$i$. By virtue of the Talbot effect, aligned mask-layers 148-$i$ are aligned with defect-rich regions 134-$i$. Therefore, aligned openings 150-$i$ will be aligned with defect-rich regions 134-$i$.

Figure 11E:
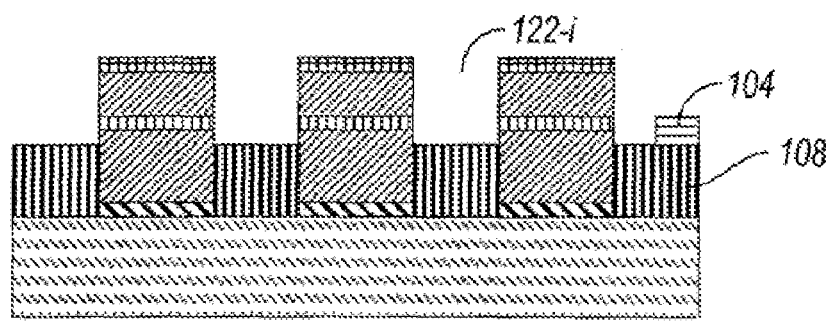

FIG. 11E illustrates the next step, where defect-rich regions 134-$i$ are at least partially removed, while keeping second electrode layer 120 intact. Defect-rich regions 134-$i$ are removed sufficiently deeply to reach n-doped layer 108.

This step forms holes 122-i. Finally, first electrode layer 104 is formed is formed over a region of n-doped layer 108 that is displaced from the photonic crystal structure, making its fabrication easier.

This method removes substantially defect rich regions 134-i, so that the remaining epi-layers 124 comprise substantially defect-poor regions 138-i. Thus, PXLEDs fabricated by this method have low defect density, reducing the mentioned detrimental effects, including poor reliability, reduced efficiency, and diminished brightness.

In substrate-emitting PXLEDs host substrate 102 is formed from a substantially transparent material, for example, sapphire, silicon carbide or glass and second electrode layer 120 is formed from a substantially reflective or opaque material, for example, Ag, Al or Au. In top-emitting PXLEDs host substrate 102 is substantially reflective or opaque, for example, metalized sapphire. In some embodiments, second electrode layer 120 is formed from a substantially transparent material, for example, ITO, or a thin metal layer.

Figure 12A:
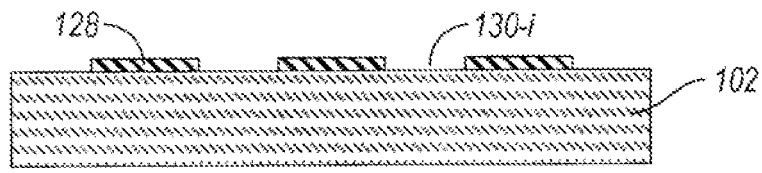
FIGS. 12A-E illustrate steps of another method for making a photonic crystal light emitting diode.
Figure 12B:
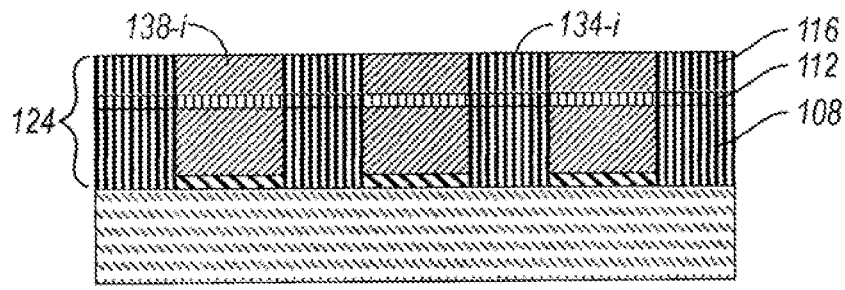

FIGS. 12A-E illustrate a method, related to the method of FIGS. 11A-E. The steps of FIGS. 12A and 12B are the same as the steps of FIGS. 11A and 11B.

Figure 12C:
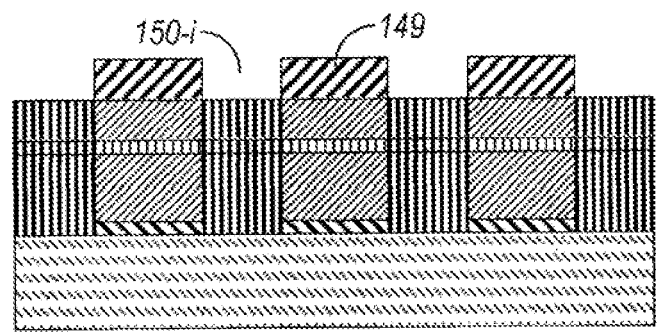

FIG. 12C illustrates an alternative utilization of the Talbot effect. In this method a photo resist is deposited as a photosensitive layer on p-doped layer 116. The photo resist is exposed using the Talbot effect. In a subsequent step the exposed portions of the photosensitive layer is removed from defect-rich regions 134-i to create a photosensitive layer 149 with aligned openings 150-i.

Figure 12D:
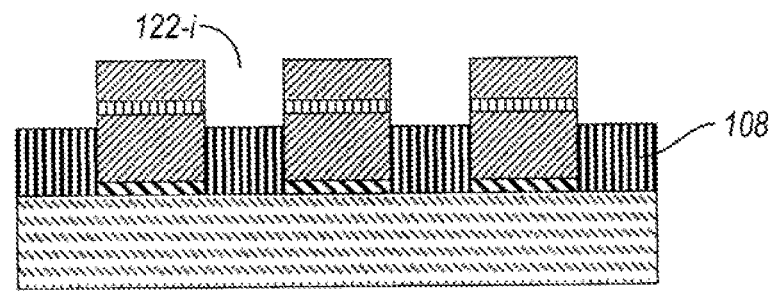

FIG. 12D illustrates the next step, in which defect-rich regions 134-i are at least partially removed to form holes 122-i, and then photosensitive layer 149 is removed. Again, defect-rich regions 134-i are removed sufficiently deeply to reach n-doped layer 108.

Figure 12E:
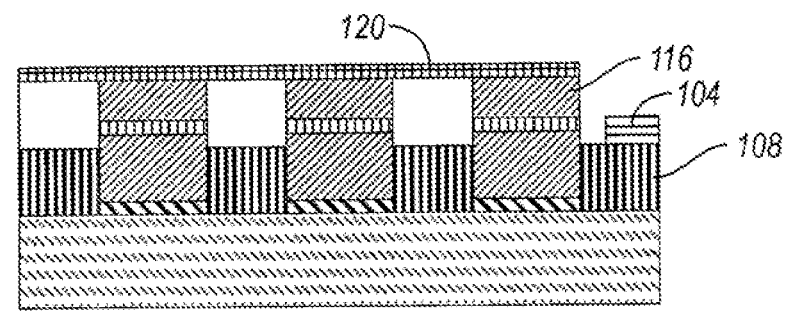

FIG. 12E illustrates the next step, in which holes 122-i are filled up with a non-conducting material 143 to make the upper surface of the device approximately flat. Non-conducting material can be, for example, a spin-on-glass ("SOG"). Then second electrode layer 120 is deposited over the approximately flat upper surface, formed by p-doped layer 116 and non-conducting material 143. By this architecture second electrode layer 120 is electrically coupled only to p-doped layer 116. Next, first electrode layer 104 is formed over a region of n-doped layer 108 that is displaced from the photonic crystal structure, making its fabrication easier. In analogy to the embodiment of FIGS. 11A-E, the PXLED fabricated by the method of FIGS. 12A-E can be a substrate-emitting or a top-emitting device.

Since in the above-described embodiments first electrode layer 104 and second electrode layer 120 are formed at horizontally removed areas, the flow of the currents includes substantially horizontal pathways.

In some embodiments host substrate 102 is a good conductor, thus first electrode layer 104 can be deposited on host substrate 102 before the formation of epi-layers 124. In these embodiments the pathways of the currents are substantially vertical across epi-layers 124.

Figure 13:
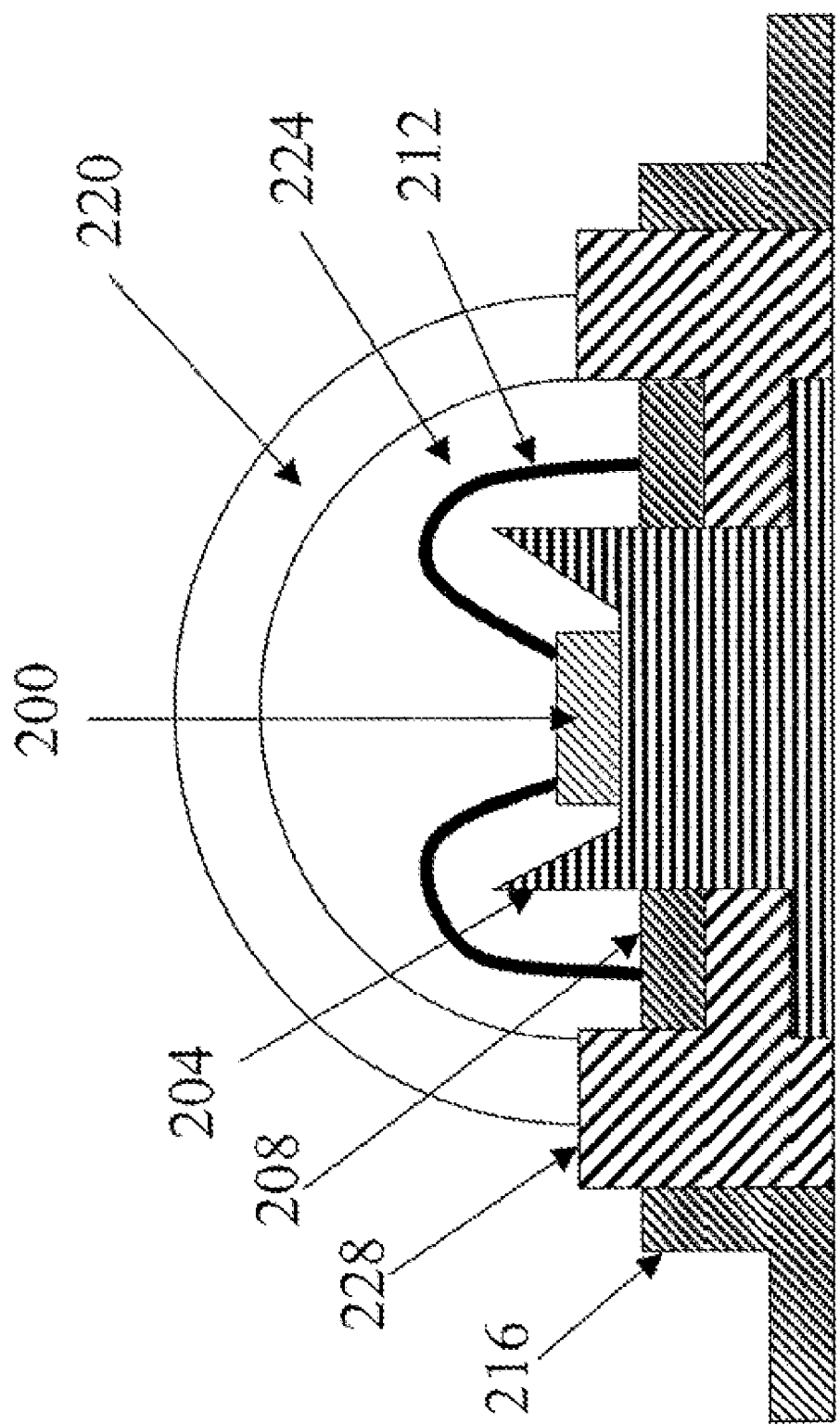
FIG. 13 illustrates a packaged LED.

FIG. 13 illustrates an embodiment of PXLED 100 in a high-power package. For example, PXLEDs with an area of 1 mm² or greater can be packaged in high-power packages. The high-power package includes a heat sink 204, formed from a low thermal resistance material. Heat sink 204 also serves as a reflector cup, reflecting the light emitted from LED 200 towards the base of the package. A further function of heat sink 204 is to accommodate and compensate the effects of the thermal expansion of the packaged LED's components. LED 200 is attached to heat sink 204 with solder or die-attach-epoxy. LED 200 is electrically coupled to inner leads 208 by wirebonds 212. In some embodiments LEDs with inverted, or flip-chip, design are electrically coupled to inner leads 208 by solderballs or solderbars. Inner leads 208 are electrically coupled to outer leads 216. Inner leads 208, outer leads 216, and wirebonds are formed from suitably chosen metals. LED 200 is encapsulated into a transparent housing that includes an epoxy dome lens 220 for enhanced light extraction. A soft gel 224 with high refractive index is disposed between LED 200 and epoxy dome lens 220 to enhance light extraction. The packaged LED is structurally supported by a support frame 228. In embodiments, where the extraction efficiency of the LED is between about 50% and 100% in air, the inclusion of lens 220 and soft gel 224 is not necessary.

There are a large number of different packages the PXLEDs can be housed in. The choice of the most suitable package depends, among others, the particular application.

The embodiments discussed above are exemplary only and are not intended to be limiting. One skilled in the art will recognize variations from the embodiments described above, which are intended to be within the scope of the disclosure. As such, the invention is limited only by the following claims.

What is claimed is:

1. A method of making a light emitting diode, the method comprising:
   providing a substrate;
   providing a masking layer overlying said substrate, the masking layer having a planar lattice of openings, wherein a ratio of a period of said planar lattice of openings to a wavelength of said emitted light in air is greater than about 0.1 and less than about 5;
   growing a semiconductor structure over the substrate and the masking layer, the semiconductor structure comprising active layer disposed between an n-type region and a p-type region;
   removing a portion of the p-type region and the light emitting layer to expose a portion of the n-type region; and
   forming a p-electrode on the p-type region and forming an n-electrode on the exposed portion of the n-type region.

2. The method of claim 1 further comprising removing said p-electrode layer at regions corresponding to said planar lattice of openings.

3. The method of claim 1, wherein said p-electrode layer is reflective.

4. The method of claim 1, wherein said semiconductor structure comprises a plurality of III-nitride layers.

5. The method of claim 1 further comprising forming a planar lattice of holes in at least said active layer and said p-type region.

6. The method of claim 1, wherein providing a masking layer having a planar lattice of openings comprises removing portions of said masking layer in a planar lattice of openings with a high resolution lithographic technique.

7. The method of claim 6, wherein removing portions of said masking layer comprises removing said portions of said masking layer with one of electron beam lithography, nano-imprint lithography, deep X-ray lithography, interferometric lithography, hot embossing, and microcontact printing.

8. The method of claim 1 further comprising forming a planar lattice of holes by a dry etch process.

9. The method of claim 1 wherein forming a p-electrode on the p-type region and forming an n-electrode on the exposed portion of the n-type region comprises forming the p- and n-electrodes on a same side of the semiconductor structure.

10. The method of claim 9 wherein the p- and n-electrodes are formed on a side of the semiconductor structure opposite the substrate.

* * * * *